(12) United States Patent
Lee et al.

(10) Patent No.: US 10,566,385 B2
(45) Date of Patent: *Feb. 18, 2020

(54) SEMICONDUCTOR APPARATUS INCLUDING MAGNETORESISTIVE DEVICE

(71) Applicant: Samsung Electronics Co., Ltd., Suwon-si, Gyeonggi-do (KR)

(72) Inventors: Yong-kyu Lee, Gwacheon-si (KR); Gwan-hyeob Koh, Seoul (KR); Hong-kook Min, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/925,043

(22) Filed: Mar. 19, 2018

(65) Prior Publication Data
US 2018/0211996 A1 Jul. 26, 2018

Related U.S. Application Data

(63) Continuation of application No. 15/131,564, filed on Apr. 18, 2016, now Pat. No. 9,954,030.

(30) Foreign Application Priority Data

Sep. 9, 2015 (KR) .......................... 10-2015-0127704

(51) Int. Cl.
*H01L 27/22* (2006.01)
*H01L 27/20* (2006.01)
(Continued)

(52) U.S. Cl.
CPC ............ *H01L 27/228* (2013.01); *H01L 27/20* (2013.01); *H01L 27/222* (2013.01); *H01L 43/08* (2013.01); *H01L 43/10* (2013.01)

(58) Field of Classification Search
CPC ....... H01L 27/20; H01L 27/22; H01L 27/222; H01L 43/08
See application file for complete search history.

(56) References Cited

U.S. PATENT DOCUMENTS 6,660,568 B1 12/2003 Gaidis
7,692,230 B2 4/2010 Liaw et al.
(Continued)

*Primary Examiner* — Thanhha S Pham
(74) *Attorney, Agent, or Firm* — Harness, Dickey & Pierce, P.L.C.

(57) ABSTRACT

A semiconductor apparatus includes a substrate, a first insulating layer on a logic region and a memory region of the substrate, a second insulating layer on the first insulating layer, a base insulating layer between the first insulating layer and second insulating layer over the logic region and the memory region, first interconnection structures passing the first insulating layer, second interconnection structures passing through the second insulating layer, a base interconnection structure passing through the base insulating layer over the logic region, and a variable resistance structure in the base insulating layer over the memory region. The variable resistance structure includes a lower electrode, a magnetoresistive device, and an upper electrode, which are sequentially stacked. The lower electrode and the upper electrode are electrically connected to one of the first interconnection structures and one of the second interconnection structures, respectively, over the memory region.

20 Claims, 27 Drawing Sheets

(51) Int. Cl.
*H01L 43/08* (2006.01)
*H01L 43/10* (2006.01)

(56) References Cited

U.S. PATENT DOCUMENTS

| | | |
|---|---|---|
| 8,216,859 B2 | 7/2012 | Murata et al. |
| 8,492,808 B2 | 7/2013 | Omori et al. |
| 8,526,221 B2 | 9/2013 | Mani |
| 8,542,524 B2 | 9/2013 | Keshtbod et al. |
| 8,674,465 B2 | 3/2014 | Li et al. |
| 8,742,521 B2 | 6/2014 | Ueki et al. |
| 8,772,051 B1 | 7/2014 | Zhong et al. |
| 8,866,242 B2 | 10/2014 | Li et al. |
| 9,954,030 B2 * | 4/2018 | Lee ......................... H01L 43/08 |
| 2009/0261433 A1 | 10/2009 | Kang et al. |
| 2010/0193850 A1 | 8/2010 | Asao et al. |
| 2012/0023386 A1 | 1/2012 | Oh et al. |
| 2012/0043630 A1 * | 2/2012 | Omori ................... H01L 27/228 |
| | | 257/421 |
| 2016/0268336 A1 * | 9/2016 | Shum ....................... H01L 43/12 |
| 2017/0092693 A1 | 3/2017 | Tan et al. |

* cited by examiner

SEMICONDUCTOR APPARATUS INCLUDING MAGNETORESISTIVE DEVICE

CROSS-REFERENCE TO RELATED APPLICATION

This application is a continuation of U.S. application Ser. No. 15/131,564, filed on Apr. 18, 2016, which claims priority under 35 U.S.C. § 119 to Korean Patent Application No. 10-2015-0127704, filed on Sep. 9, 2015, in the Korean Intellectual Property Office, the disclosures of each of which are incorporated herein in their entirety by reference.

BACKGROUND

The present disclosure relates to a semiconductor apparatus including a magnetoresistive device, and more particularly, to a semiconductor apparatus including a magnetoresistive device and a logic device.

With the rapid development of electronic industries and the increasing demands of users, electronic devices have become smaller and lighter. In this regard, an embedded semiconductor apparatus, in which a memory device and a logic device are integrated into a single chip, has been proposed. Such an embedded semiconductor apparatus may use various types of memories, such as a read-only memory (ROM), a volatile memory for a cache, and a non-volatile memory capable retaining data even when power is turned off.

SUMMARY

Inventive concepts relate to a semiconductor apparatus including a memory device implemented by a magnetoresistive device.

According to example embodiments of inventive concepts, a semiconductor apparatus including: a substrate including a logic region and a memory region; a first insulating layer on the logic region and the memory region; a second insulating layer on the first insulating layer over the logic region and the memory region; a base insulating layer a between the first insulating layer and the second insulating layer over the logic region and the memory region; first interconnection structures passing through the first insulating layers over the logic region and the memory region; second interconnection structures passing through the second insulating layers over the logic region and the memory region; a base interconnection structure passing through the base insulating layer over the logic region; and a variable resistance structure in the base insulating layer over the memory region. The variable resistance structure including a lower electrode, a magnetoresistive device, and an upper electrode, which are sequentially stacked. The lower electrode and the upper electrode are connected to one of the first interconnection structures and one of the second interconnection structures over the memory region.

In example embodiments, a bottom surface of the lower electrode and a top surface of the upper electrode may have substantially a same level as a bottom surface and a top surface of the base insulating layer, respectively.

In example embodiments, a top surface of the first interconnection structure and a bottom surface of the second interconnection structure may have substantially a same level as the bottom surface of the lower electrode and the top surface of the upper electrode in the variable resistance structure.

In example embodiments, each of the first interconnection structures, the second interconnection structures, and the base interconnection structures may include a via plug and an interconnection layer on the via plug.

In example embodiments, the variable resistance structure may overlap the via plug of the one of the first interconnection structures and the via plug of the one of the second interconnection structures in a direction perpendicular to a main surface of the substrate.

In example embodiments, the variable resistance structure may overlap the interconnection layer of the one of the first interconnection structures and the interconnection layer of the one of the second interconnections structure in a direction perpendicular to the main surface of the substrate.

In example embodiments, a top surface of the upper electrode of the variable resistance structure may have a substantially a same level as a top surface of the interconnection layer of the base interconnection structure over the logic region.

In example embodiments, a bottom surface of the lower electrode of the variable resistance structure may have substantially a same level as a bottom surface of the via plug of the base interconnection structure over the logic region.

In example embodiments, the upper electrode of the variable resistance structure may include a first upper electrode and a second upper electrode on the first upper electrode, and a top surface of the first upper electrode may have a higher level than a top surface of the via plug of the base interconnection structure over the logic region.

In example embodiments, a top surface of the magnetoresistive device of the variable resistance structure may have a higher level than a top surface of the via plug of the base interconnection structure over the logic region.

In example embodiments, via plug and the interconnection layer of the base interconnection structure over the logic region may be integrally formed. The via plug and the interconnection layer may include a first conductive material including a metal.

In example embodiments, the lower electrode and the upper electrode of the variable resistance structure may include a second conductive material including a metal. The second conductive material may be different than the first conductive material.

In example embodiments, sidewalls of the upper electrode, the magnetoresistive device, and the lower electrode of the variable resistance structure may define a coplanar surface.

In example embodiments, the magnetoresistive may include a tunnel barrier, a first magnetization layer, and a second magnetization layer. The tunnel barrier may be between the first magnetization layer and the second magnetization layer.

In example embodiments, the base interconnection structure may electrically connect one of the first interconnection structures over the logic region to one of the second interconnection structures over the logic region.

In example embodiments, the base insulating layer may include an upper insulating layer on a lower insulating layer, and the base interconnection structure may include a lower interconnection structure in the lower insulating layer and an upper interconnection structure a in the upper insulating layer.

In example embodiments, the variable resistance structure may be over the lower insulating layer and the upper insulating layer.

In example embodiments, the lower electrode of the variable resistance structure may be in the lower insulating layer, and the magnetoresistive device and the upper electrode may be in the upper insulating layer.

In example embodiments, a bottom surface of the lower electrode of the variable resistance structure may have substantially a same level as a bottom surface of the one of the lower interconnection structures over the memory region.

The lower interconnection structure may include a lower interconnection layer on a lower via plug, and the upper interconnection structure may include an upper interconnection layer on an upper via plug.

According to example embodiments of inventive concepts, a semiconductor apparatus includes: a substrate including a logic region and a memory region; a first insulating layer, a base insulating layer, and a second insulating layer sequentially arranged on the substrate; a first interconnection structure, a base interconnection structure, and a second interconnection structure in the first insulating layer, the base insulating layer, and the second insulating layer, respectively; and a variable resistance structure in the base insulating layer over the memory region. Each of the first insulating layer, the base insulating layer, and the second insulating layer includes an interconnection layer on a via plug. The variable resistance structure includes a magnetoresistive device, an upper electrode connected to an upper portion of the magnetoresistive device, and a lower electrode connected to a lower portion of the magnetoresistive device. The variable resistance structure overlaps the interconnection layers of the first and second interconnection structures over the memory region in a direction perpendicular to a main surface of the substrate.

In example embodiments, in the logic region, the interconnection layer of the first interconnection structure may be connected to the via plug of the base interconnection structure, and the interconnection layer of the base interconnection structure may be connected to the via plug of the second interconnection structure.

In example embodiments, a top surface of the variable resistance structure of the memory region may have substantially a same level as a top surface of the interconnection layer of the base interconnection structure over the logic region.

In example embodiments, a bottom surface of the variable resistance structure of the memory region may have substantially a same level as a bottom surface of the via plug of the base interconnection structure over the logic region.

In example embodiments, the variable resistance structure may overlap the via plugs of the first and second interconnection structures over the memory region in the direction perpendicular to the main surface over the substrate.

In example embodiments, the via plug and the interconnection layer of each of the first interconnection structure, the second interconnection structure, and the base interconnection structure may be integrally formed.

In example embodiments, the lower electrode and the upper electrode of the variable resistance structure may include a material different from the first interconnection structure, the second interconnection structure, and the base interconnection structure.

In example embodiments, the first interconnection structure, the second interconnection structure, and the base interconnection structure may respectively pass through the first insulating layer, the second insulating layer, and the base insulating layer.

In example embodiments, the upper electrode, the magnetoresistive device, and the lower electrode of the variable resistance structure may overlap one another in the direction perpendicular to the main surface of the substrate.

In example embodiments, the base insulating layer may include an upper insulating layer on a lower insulating layer, and the bottom electrode of the variable resistance structure may pass through the lower insulating layer.

According to example embodiments of inventive concepts, a semiconductor apparatus includes a substrate including a logic region and a memory region, a plurality of insulating layers on the substrate over the logic region and the memory region, a first interconnection structure, a base interconnection structure, a variable resistance structure, and second interconnection structures. The plurality of insulating layers include a base insulating layer between a first insulating layer and a second insulating layer. The first interconnection structure passes through the first insulating layer over the logic region. The base interconnection structure passes through the base insulating layer over the logic region. The variable resistance structure passes through the base insulating layer over the memory region. The second interconnection structures passes through the second insulating layer over the logic region and the memory region. A first one of the second interconnection structures is on the first interconnection structure over the logic region. A second one of the second interconnection structures is on the variable resistance structure.

In example embodiments, the variable resistance structure may include a magnetoresistive device between a lower electrode and an upper electrode. A top surface of the upper electrode may have substantially a same level as a top surface of the base insulating layer, and the top surface of the upper electrode may be level with a top surface of the base interconnection structure.

In example embodiments, a bottom surface of the base interconnection structure may be a same level as a bottom surface of the variable resistance structure or a top surface of the lower electrode.

In example embodiments, the base interconnection structure may electrically connect one of the first interconnection structures over the logic region to one of the second interconnection structure over the logic region.

In example embodiments, the semiconductor apparatus may further include a plurality of first interconnection structures passing through the first insulating layer. The first interconnection structure passing through the first insulating layer over the logic region may be a first one of the first interconnection structures. A second one of the first interconnection structures may pass through the first insulating layer over the memory region. The variable resistance structure may be between the second one of the second interconnection structures and the second one of the first interconnection structures.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Figure 1A:
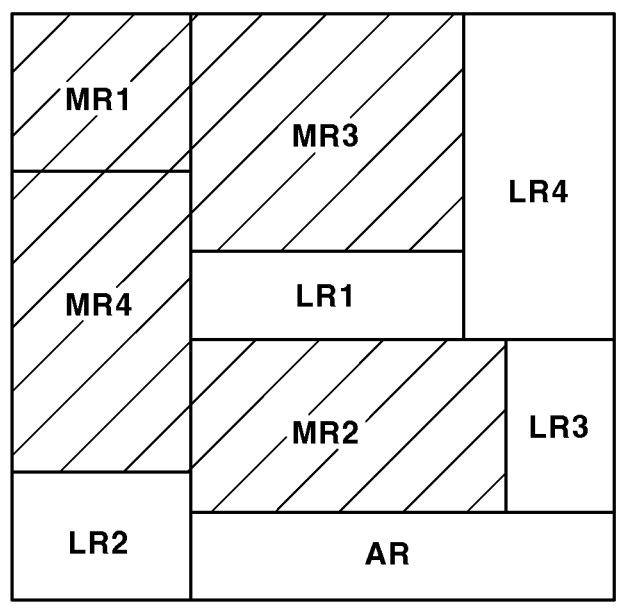
FIG. 1A is a configuration diagram of a semiconductor apparatus according to example embodiments of inventive concepts.

Hereinafter, example embodiments will be described in detail with reference to the accompanying drawings. In the drawings, the thicknesses of layers and regions are exaggerated for clarity. In the drawings, like reference numbers are used to refer to like elements and redundant descriptions thereof will be omitted.

Example embodiments may be embodied in many different forms and should not be construed as being limited to the embodiments set forth herein; rather, these embodiments are provided so that this disclosure will be thorough and complete, and will fully convey the scope of inventive concepts to those of ordinary skill in the art. As used herein, the term "and/or" includes any and all combinations of one or more of the associated listed items. Expressions such as "at least one of" when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

When a certain embodiment may be implemented differently, a specific process order may be performed differently from the described order. For example, two consecutively described processes may be performed substantially at the same time or performed in an order opposite to the described order.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments of inventive concepts will be described with reference to the drawings schematically illustrating idealized embodiments. In the accompanying drawings, the modifications of the illustrated shapes may be expected according to manufacturing technologies and/or tolerance. Therefore, the example embodiments should not be construed as being limited to specific shapes of the illustrated regions. The shapes may be changed during the manufacturing processes.

Unless otherwise defined, all terms (including technical and scientific terms) used herein have the same meaning as commonly understood by one of ordinary skill in the art to which example embodiments of inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1A is a configuration diagram of a semiconductor apparatus 1 according to example embodiments of inventive concepts.

Referring to FIG. 1A, the semiconductor apparatus 1 may include a plurality of memory regions MR1 to MR4 and a plurality of logic regions LR1 to LR4. The semiconductor apparatus 1 may be an embedded semiconductor apparatus in which a memory device and a logic device are integrated into a single chip. The semiconductor apparatus 1 may further include an analog region AR in which an analog device is formed. Heterogeneous memory devices or homogeneous memory devices may be formed in the plurality of memory regions MR1 to MR4. Intellectual properties (IPs), such as a main processing unit (MPU), a graphic processing unit (GPU), an interface, or other function blocks, may be respectively disposed in the first to fourth logic regions LR1 to LR4.

For example, volatile memory devices may be formed in the first and second memory regions MR1 and MR2, a non-volatile memory device may be formed in the third memory region MR3, and a ROM may be formed in the fourth memory region MR4. Alternatively, non-volatile memory devices may be formed in all the first to fourth memory regions MR1 to MR4.

The volatile memory device may be a static random access memory (SRAM) and/or a dynamic RAM (DRAM). The non-volatile memory device may be a magnetoresistive RAM (MRAM), a phase-change RAM (PRAM), a resistive RAM (RRAM), and/or a flash memory, but is not limited thereto. The ROM may be a programmable ROM (PROM) or an electrically erasable programmable ROM (EEPROM).

In many cases, a general embedded semiconductor apparatus may include a SRAM as a volatile memory device and a flash memory as a non-volatile memory device. That is, SRAMs may be formed in some of the plurality of memory regions MR1 to MR4, and flash memories may be formed in others.

For reference, the MRAM is a non-volatile memory device based on magnetoresistance. Since the MRAM is non-volatile, data stored in the MRAM may be retained even when power is turned off. Generally, a non-volatile memory device is slower than a volatile memory device, but the MRAM may have a read/write response time as fast as a volatile memory device. For example, the MRAM may be an all-round memory device having low cost and high capacity characteristics of the DRAM, high speed operation characteristics of the SRAM, and non-volatile characteristics of the flash memory.

In the semiconductor apparatus 1 according to example embodiments of inventive concepts, the MRAM may be formed in at least one of the first to fourth memory regions MR1 to MR4. For example, in the general embedded semiconductor apparatus, the MRAM may be formed in a region where the flash memory is formed. Alternatively, in the semiconductor apparatus 1 according to example embodiments of inventive concepts, MRAMs may be formed in all the first to fourth memory regions MR1 to MR4. In example embodiments of inventive concepts, MRAMs may be formed in the first and second memory regions MR1 and MR2 so as to replace SRAMs, a MRAM may be formed in the third memory region MR3 so as to replace a flash memory, and a MRAM may be formed in the fourth memory region MR4 so as to replace a ROM. In this case, in the general embedded semiconductor apparatus, MRAMs having different device characteristics may be formed in the first to fourth memory regions MR1 to MR4 in order for compatibility with IPs disposed in the logic regions.

The semiconductor apparatus 1 may be formed without changing predesigned IPs by forming MRAMs having different device characteristics in the plurality of memory regions MR1 to MR4 in order for compatibility with IPs to be disposed in the plurality of logic regions LR1 to LR4.

Figure 1B:
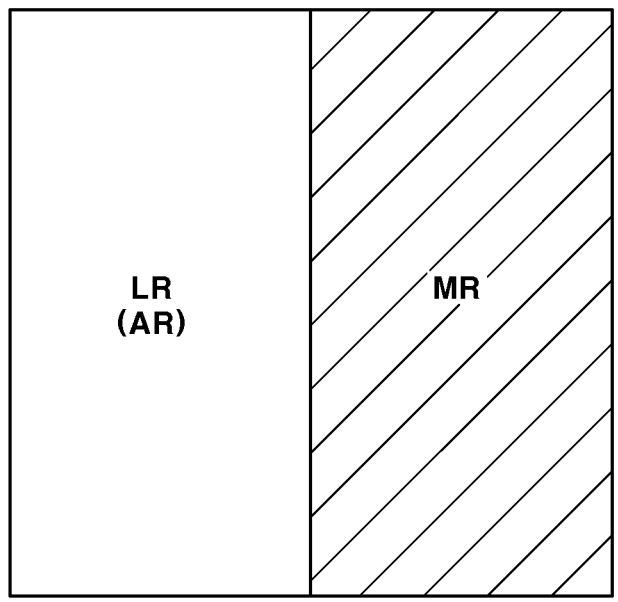
FIG. 1B is a configuration diagram of a semiconductor apparatus according to example embodiments of inventive concepts.

FIG. 1B is a configuration diagram of a semiconductor apparatus 2 according to example embodiments of inventive concepts.

Referring to FIG. 1B, the semiconductor apparatus 2 may include a memory region MR and a logic region LR. The semiconductor apparatus 2 may be an embedded semiconductor apparatus in which a memory device and a logic device are integrated into a single chip. A MRAM may be formed in the memory region MR. Various logic devices may be formed in the logic region LR. In example embodiments of inventive concepts, the logic region LR may include an analog region AR in which an analog device is formed. An MRAM having a logically unified organization may be formed in the memory region MR.

By forming the MRAM having the logically unified organization in the memory region MR, the semiconductor apparatus 2 may achieve cost reduction, performance improvement, and design simplification.

Figure 2A:
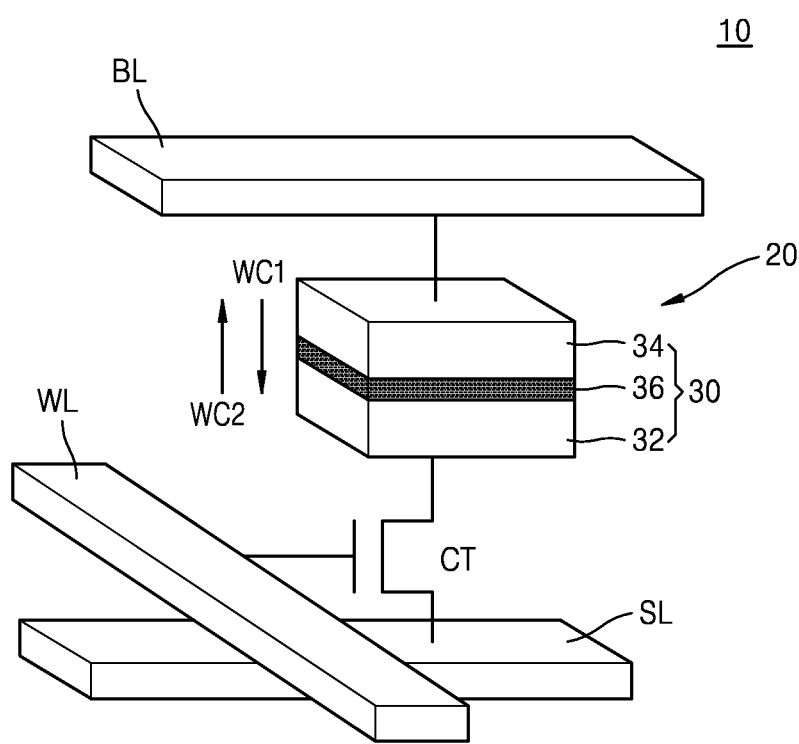
FIG. 2A is a perspective view of a magnetic device according to example embodiments of inventive concepts.

FIG. 2A is a perspective view of a magnetic device 10 according to example embodiments of inventive concepts.

Referring to FIG. 2A, the magnetic device 10 may include a memory cell 20. The memory cell 20 may be a spin transfer torque magnetic random access memory (STT-MRAM).

The memory cell 20 may include a cell transistor CT and a magnetoresistive device 30 having a magnetic tunnel junction (MTJ) structure. A gate of the cell transistor CT may be connected to a word line WL, one electrode of the cell transistor CT may be connected to a bit line BL through the magnetoresistive device 30, and another electrode of the cell transistor CT may be connected to a source line SL.

The magnetoresistive device 30 may include a free layer 32, a pinned layer 34, and a tunnel barrier layer 36 disposed therebetween. The free layer 32 may have a magnetization easy axis in a direction perpendicular to an extending direction of the free layer 32, and a magnetization direction thereof may be variable according to a condition. The pinned layer 34 may have a magnetization easy axis in a direction perpendicular to an extending direction of the pinned layer 34, and a magnetization direction thereof may be pinned.

The free layer 32 and the pinned layer 34 may include a magnetic material having high magnetic anisotropy energy. Examples of the magnetic material having high magnetic anisotropy energy may include an amorphous-based rare-earth element alloy, a multilayer thin film such as (Co/Pt)n or (Fe/Pt)n, and an ordered lattice material having a L10 crystal structure.

In example embodiments of inventive concepts, at least one of the free layer 32 and the pinned layer 34 may include at least one of Fe, Co, Ni, Pd, and Pt. In example embodiments of inventive concepts, at least one of the free layer 32 and the pinned layer 34 may include a Co-M1 alloy (where M1 is at least one metal, and may include one of Pt, Pd, and Ni), or a Fe-M2 alloy (where M2 is at least one metal, and may include one of Pt, Pd, and Ni). In example embodiments of inventive concepts, at least one of the free layer 32 and the pinned layer 34 may further include at least one of B, C, Cu, Ag, Au, Ru, Ta, and Cr.

The free layer 32 and the pinned layer 34 may be referred to as a first magnetization layer 32 and a second magnetization layer 34, respectively.

The tunnel barrier layer 36 may include a non-magnetic material. The tunnel barrier layer 36 may include an oxide of one material selected from Mg, Ti, Al, MgZn, and MgB. In example embodiments of inventive concepts, the tunnel barrier layer 36 may include Ti nitride or V nitride. The tunnel barrier layer 36 may be thinner than a spin diffusion distance.

A resistance of the magnetoresistive device 30 may be changed according to the magnetization direction of the free layer 32. When the magnetization direction of the free layer 32 is parallel to the magnetization direction of the pinned layer 34, the magnetoresistive device 30 may have a low resistance and store data "0". When the magnetization direction of the free layer 32 is antiparallel to the magnetization direction of the pinned layer 34, the magnetoresistive device 30 may have a high resistance and store data "1".

The arrangement of the free layer 32 and the pinned layer 34 is limited to the example of FIG. 2A, and the free layer 32 may exchange positions with the pinned layer 34.

In order for a write operation of the STT-MRAM in the magnetic device 10 illustrated in FIG. 2A, the cell transistor CT may be turned on by applying a logic high voltage to the word line WL, so that write currents WC1 and WC2 flow between the bit line BL and the source line SL. At this time, the magnetization direction of the free layer 32 may be determined according to directions of the write currents WC1 and WC2. The magnetization direction of the free layer 32 in the magnetoresistive device 30 may be changed by spin transfer torque (STT) phenomenon.

The STT phenomenon may refer to a phenomenon that, when a current whose spin is polarized in one direction flows, a magnetization direction of a magnetic layer is changed by spin transfer of electron. Accordingly, a MRAM using the STT phenomenon may also be referred to as a STT-RAM or a STT-MRAM.

More specifically, in the STT-MRAM, when the write currents WC1 and WC2 flow through the MTJ, e.g., the magnetoresistive device 30, the pinned layer 34 may polarize electron spins of the write currents WC1 and WC2, and a spin-polarized electron current may interact with the free layer 32 while applying a torque to the free layer 32. When the torque of the spin-polarized electron current passing through the MTJ is greater than a threshold switching current density, the torque applied by the spin-polarized electron current may be sufficient to switch the magnetization direction of the free layer 32. Accordingly, the magnetization direction of the free layer 32 may be arranged in parallel or antiparallel to the pinned layer 34, and the resistance state of the magnetoresistive device 30 may be changed.

Since the STT-MRAM switches the magnetization direction of the free layer 32 through the spin-polarized electron current, it may be unnecessary to generate a magnetic field by applying a large current so as to switch the magnetization direction of the free layer 32. Therefore, the STT-MRAM may contribute to a reduction in a cell size and a reduction in a program current and may also solve a write failure problem. In addition, since the STT-MRAM has a high tunnel magnetoresistance ratio (TMR) and a high ratio between a high resistance state and a low resistance state, it is possible to improve a read operation in a magnetic domain.

In order for a read operation of the STT-MRAM in the magnetic device 10 illustrated in FIG. 2A, the cell transistor CT may be turned on by applying a logic high voltage to the word line WL, and data stored in the magnetoresistive device 30 may be determined by applying a read current in a direction from the bit line BL to the source line SL. At this time, since the intensity of the read current is much less than the intensity of the write currents WC1 and WC2, the magnetization direction of the free layer 32 may not be changed by the read current.

Figure 2B:
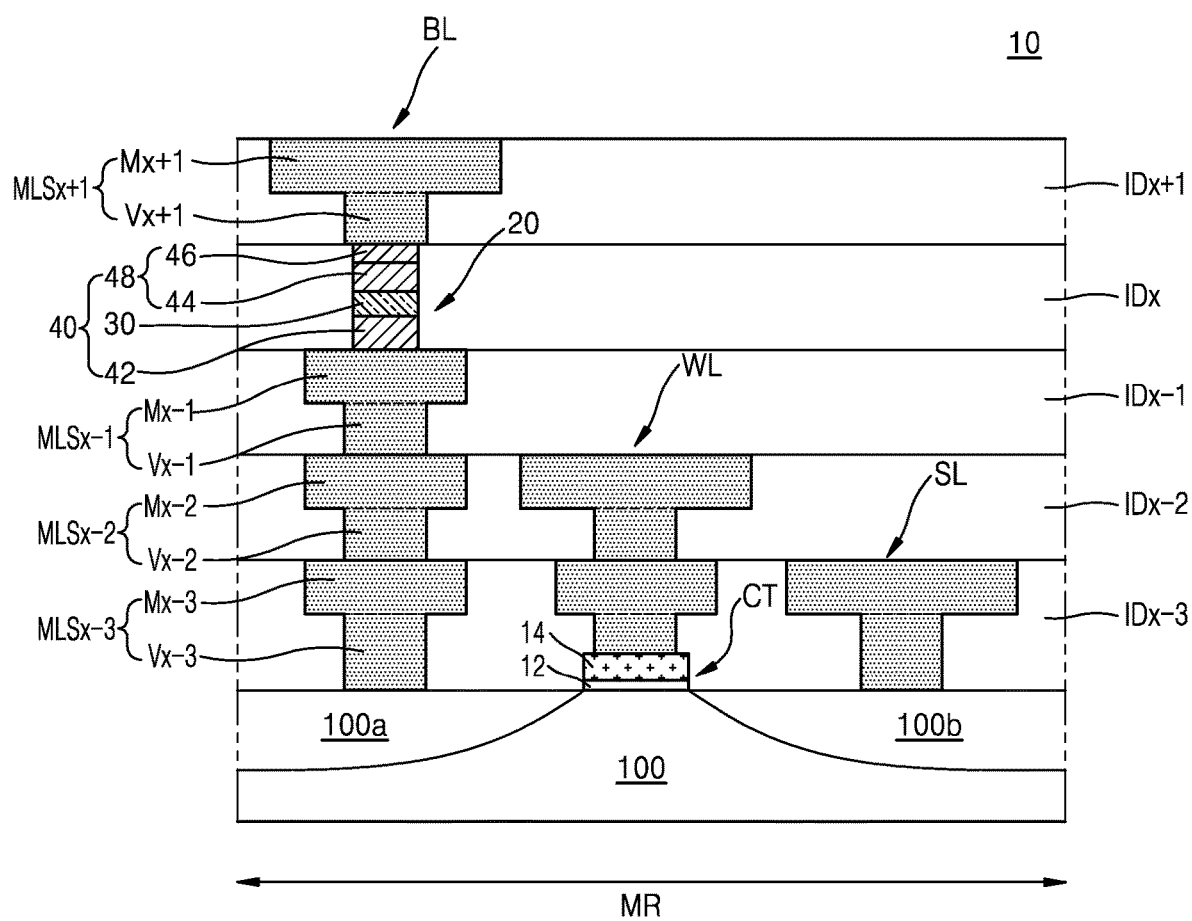
FIG. 2B is a cross-sectional view of the magnetic device of FIG. 2A.

FIG. 2B is a cross-sectional view of the magnetic device 10 of FIG. 2A.

Referring to FIG. 2B, the magnetic device 10 may include a memory cell 20 formed in a memory region MR of a substrate 100, and the memory cell 20 may be a STT-MRAM. The memory cell 20 may include a cell transistor CT and a magnetoresistive device 30 having a MTJ structure. The cell transistor CT may include a gate insulating film 12 on the substrate 100, a gate electrode 14 on the gate insulating film 12, and first and second source/drain regions 100a and 100b on both sides of the gate electrode 14. The gate electrode 14 of the cell transistor CT may be connected to the word line WL, the first source/drain region 100a of the cell transistor CT may be connected to the bit line BL through the magnetoresistive device 30, and the second source/drain region 100b of the cell transistor CT may be connected to the source line SL.

The substrate 100 may include at least one of a group III-V material and a group IV material. The substrate 100 may include a semiconductor such as silicon (Si) or germanium (Ge), or a compound semiconductor such as silicon germanium (SiGe), silicon carbide (SiC), gallium arsenide (GaAs), indium arsenide (InAs), and indium phosphide (InP). The group III-V material may be a binary, ternary, or quaternary compound including at least one group III element and at least one group V element. The group III-V material may be compound including at least one element selected from In, Ga, and Al as the group III element and at least one element selected from As, P, and Sb as the group V element. For example, the group III-V material may be selected from InP, $In_zGa_{1-z}As$ ($0 \le z \le 1$), and $Al_zGa_{1-z}As$ ($0 \le z \le 1$). The binary compound may be any one selected from InP, GaAs, InAs, InSb, and GaSb. The ternary compound may be any one selected from InGaP, InGaAs, AlInAs, InGaSb, GaAsSb, and GaAsP. The group IV material may be Si or Ge. However, the group III-V material and the group IV material, which are usable in the semiconductor apparatus according to example embodiments of inventive concepts, are not limited to the above examples. In example embodiments of inventive concepts, the substrate 100 may have a silicon on insulator (SOI) structure. In example embodiments of inventive concepts, the substrate 100 may include a buried oxide (BOX) layer. The substrate 100 may include a conductive region, e.g., a well doped with an impurity, or a structure doped with an impurity. The substrate 100 may have various device isolation structures, such as a shallow trench isolation (STI) structure or a deep trench isolation (DTI) structure.

A plurality of insulating layers IDx−3, IDx−2, IDx−1, IDx, and IDx+1 may be sequentially stacked on the substrate 100. Each of the plurality of insulating layers IDx−3, IDx−2, IDx−1, IDx, and IDx+1 may include an oxide film or a low-k dielectric film having a lower dielectric constant than a silicon oxide film. The low-k dielectric film may be a SiOC film or a SiCOH film. In example embodiments of inventive concepts, each of the plurality of insulating layers IDx−3, IDx−2, IDx−1, IDx, and IDx+1 may include a base insulating layer (210 of FIG. 6) including the oxide film or the low-k dielectric film, and a capping insulating layer (220 of FIG. 6) covering the base insulating layer 210. The capping insulating layer 220 may be used as a diffusion barrier layer for a metal interconnection. The capping insulating layer 220 may be a SiC film or a SiN film.

Five insulating layers IDx−3, IDx−2, IDx−1, IDx, and IDx+1 are illustrated in FIG. 2B as being stacked on the substrate 100, but are not limited thereto. For example, six or more insulating layers may be stacked on the substrate 100.

Interconnection structures MLSx−3, MLSx−2, MLSx−1, and MLSx+1 may be respectively formed in at least some insulating layers IDx−3, IDx−2, IDx−1, and IDx+1 among the plurality of insulating layers IDx−3, IDx−2, IDx−1, IDx, and IDx+1. For example, the first interconnection structure MLSx−1 may be formed in the first insulating layer IDx−3, the second interconnection structure MLSx−2 may be formed in the second insulating layer IDx−2, the third interconnection structure MLSx−1 may be formed in the third insulating layer IDx−1, and the fifth interconnection structure MLSx+1 may be formed in the fifth insulating layer IDx+1. A barrier layer (not illustrated) and/or a seed layer (not illustrated) may be formed in a side surface and a bottom surface of each of the interconnection structures MLSx−3, MLSx−2, MLSx−1, and MLSx+1. The first, second, third, and fifth interconnection structures MLSx−3, MLSx−2, MLSx−1, and MLSx+1 may pass through the first, second, third, and fifth insulating layers IDx−3, IDx−2, IDx−1, and IDx+1, respectively. A separate interconnection structure may not be formed in the fourth insulating layer IDx of the memory region MR, but a fourth interconnection structure MLSx may be formed in a fourth insulating layer IDx of a logic region (LR of FIG. 5).

The interconnection structures MLSx−3, MLSx−2, MLSx−1, and MLSx+1 may respectively include via plugs Vx−3, Vx−2, Vx−1, and Vx+1 and interconnection layers Mx−3, Mx−2, Mx−1, and Mx+1 disposed on the via plugs Vx−3, Vx−2, Vx−1, and Vx+1.

In at least some of the interconnection structures MLSx−3, MLSx−2, MLSx−1, and MLSx+1, the via plugs Vx−3, Vx−2, Vx−1, and Vx+1 and the interconnection layers Mx−3, Mx−2, Mx−1, and Mx+1 may be integrally formed by using a first conductive material including a metal. For example, each of the interconnection structures MLSx−3, MLSx−2, MLSx−1, and MLSx+1 may be integrally formed by using copper or the first conductive material including copper. The barrier layer may include Ta, Ti, TaN, TiN, or combinations thereof. The seed layer may include the same metal element or the same material as the material of the interconnection structures MLSx−3, MLSx−2, MLSx−1, and MLSx+1. For example, the seed layer may include copper or a conductive material including copper.

Among the interconnection structures MLSx−3, MLSx−2, MLSx−1, and MLSx+1, the line interconnection structures MLSx−2, MLSx−1, and MLSx+1 disposed in a relatively upper side from the substrate 100 may be connected to the substrate 100 through the interconnection structures MLSx−3, MLSx−2, and MLxSx−1 disposed in a relatively lower side from the substrate 100.

A portion of the interconnection layer Mx−1 of the interconnection structure MLSx−3, which is one of the plurality of interconnection structures MLSx−3, MLSx−2, MLSx−1, and MLSx+1, may constitute the source line SL. A portion of the interconnection layer Mx−2 of the interconnection structure MLSx−2, which is one of the plurality of interconnection structures MLSx−3, MLSx−2, MLSx−1, and MLSx+1, may constitute the word line WL. A portion of the interconnection layer Mx+1 of the interconnection structure MLSx+1, which is one of the plurality of interconnection structures MLSx−3, MLSx−2, MLSx−1, and MLSx+1, may constitute the bit line BL.

In FIG. 2B, a portion of the interconnection layer Mx−1 of the first interconnection structure MLSx−1 is illustrated as constituting the source line SL and a portion of the interconnection layer Mx−2 of the second interconnection structure MLSx−2 is illustrated as constituting the word line WL, but these are merely examples and are not limited thereto. In example embodiments of inventive concepts, the source line SL may have a higher level with respect to a main surface of the substrate 100 than the word line WL.

The first insulating layer IDx−1 surrounding the gate insulating film 12, the gate electrode 14, and the periphery of the first interconnection structure MLSx−1 is illustrated as a single layer, but is not limited thereto. For example, the first insulating layer IDx−1 may be a multilayer structure in which a first portion covering a region between a top surface of the substrate 100 and a top surface of the gate electrode 14 and a second portion covering a region between the top surface of the gate electrode 14 and a top surface of the interconnection layer Mx−1 of the first interconnection structure MLSx−1 are separate insulating material layers. In this case, the first interconnection structure MLSx−1 may include conductive materials separately formed in the first portion and the second portion of the first insulating layer IDx−3.

In example embodiments of inventive concepts, the gate insulating film 12 may include at least one of a silicon oxide film, a silicon nitride film, a silicon oxynitride film, an oxide/nitride/oxide film, and a high-k dielectric film having a higher dielectric constant than a silicon oxide film. For example, the gate insulating film 12 may have a dielectric constant of about 10 to about 25. In example embodiments of inventive concepts, the gate insulating film 12 may include at least one material selected from hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxide nitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the gate insulating film 12 may include $HfO_2$, $Al_2O_3$, $HfAlO_3$, $Ta_2O_3$, or $TiO_2$. In example embodiments of inventive concepts, the gate electrode 14 may include at least one material selected from doped semiconductor, a metal, conductive metal nitride, and a metal-semiconductor compound. In example embodiments of inventive concepts, the gate electrode 14 may include at least one of Ti, TiN, Ta, TaN, W, WN, TiSiN, and WSiN, but is not limited thereto.

The gate electrode 14 may be formed on the substrate 100 as illustrated in FIG. 2B, but is not limited thereto. For example, the magnetic device 10 may include the gate electrode 14 buried in the substrate 100 so that the top surface of the gate electrode 14 is lower than the top surface of the substrate 100.

In FIG. 2B, the widths of the interconnection layers Mx−3, Mx−2, Mx−1, and Mx+1 are illustrated as being greater than the widths of the via plugs Vx−3, Vx−2, Vx−1, and Vx+1, and the widths of some of the interconnection layers Mx−3, Mx−2, Mx−1, and Mx+1 are illustrated as being greater than others. However, these are only for distinguishing functional characteristics of the interconnection structures MLSx−3, MLSx−2, MLSx−1, and MLSx+1. Inventive concepts are not limited thereto. For example, in FIG. 2B and subsequent drawings, interconnection layers used as the bit line BL, the word line WL, and the source line SL among the interconnection layers Mx−3, Mx−2, Mx−1, and Mx+1 are illustrated as having relatively large widths, and interconnection layers functioning as a stud are illustrated as having relatively small widths.

The bit line BL and the word line WL may extend in different directions. The source line SL and the word line WL may extend in parallel, or may extend in different directions.

A variable resistance structure 40 including the magnetoresistive device 30 may be formed in the fourth insulating layer IDx of the memory region MR. The variable resistance structure 40 may include a lower electrode 42, the magnetoresistive device 30, and an upper electrode 48, which are sequentially stacked. The lower electrode 42 and the upper electrode 48 may include a second conductive material including a metal, which is different from the first conductive material. The upper electrode 48 may include a first upper electrode 44 and a second upper electrode 46.

The lower electrode 42 and the first upper electrode 44 may include a conductive material having a relatively low reactivity. In example embodiments of inventive concepts, at least one of the lower electrode 42 and the first upper electrode 44 may have a single layer including at least one material selected from Ti, Ta, Ru, Al, W, TaN, and TiN, or a multilayer structure including a plurality of materials selected therefrom.

The second upper electrode 46 may include a metal or metal nitride. In example embodiments of inventive concepts, the second upper electrode 46 may include at least one material selected from Ru, W, TiN, TaN, Ti, Ta, and a metallic glass alloy. For example, the second upper electrode 46 may have a double layer structure of Ru/TiN or TiN/W. The second upper electrode 46 may be a residual portion after being used as a hard mask in a process of patterning the lower electrode 42, the magnetoresistive device 30, and/or the first upper electrode 44.

Since the configuration of the magnetoresistive device 30 has been described in detail with reference to FIG. 2A, detailed descriptions thereof will not be repeated.

The fourth insulating layer IDx, in which the variable resistance structure 40 is formed, may be referred to as a base insulating layer. In example embodiments of inventive concepts, in a case where the variable resistance structure 40 is formed over two or more insulating layers, the two or more insulating layers may be referred to as a base insulating layer.

When the fourth insulating layer IDx, in which the variable resistance structure 40 is formed, is referred to as the base insulating layer IDx, the third insulating layer IDx−1 under the base insulating layer IDx and the fifth insulating layer IDx+1 above the base insulating layer IDx may be respectively referred to as a first insulating layer and a second insulating layer, and the third interconnection structure MLSx−1 and the fifth interconnection structure MLSx+1 may be respectively referred to as a first interconnection structure and a second interconnection structure. That is, the variable resistance structure 40 may be formed in the base insulating layer IDx disposed between the first insulating layer IDx−1 and the second insulating layer IDx+1. The first interconnection structure MLSx−1 and the second interconnection structure MLSx+1 may be electrically connected to the lower electrode 42 and the upper electrode 48 of the variable resistance structure 40, respectively.

The variable resistance structure 40 may be formed to pass through the base insulating layer IDx. Therefore, the bottom surface of the lower electrode 42 and the top surface of the upper electrode 48 in the variable resistance structure 40 may have substantially the same levels as the bottom surface and the top surface of the base insulating layer IDx, respectively. In addition, the top surface of the first interconnection structure MLSx−1 and the bottom surface of the second interconnection structure MLSx+1 may have substantially the same levels as the bottom surface of the lower electrode 42 and the top surface of the upper electrode 48 in the variable resistance structure 40, respectively.

Figure 3:
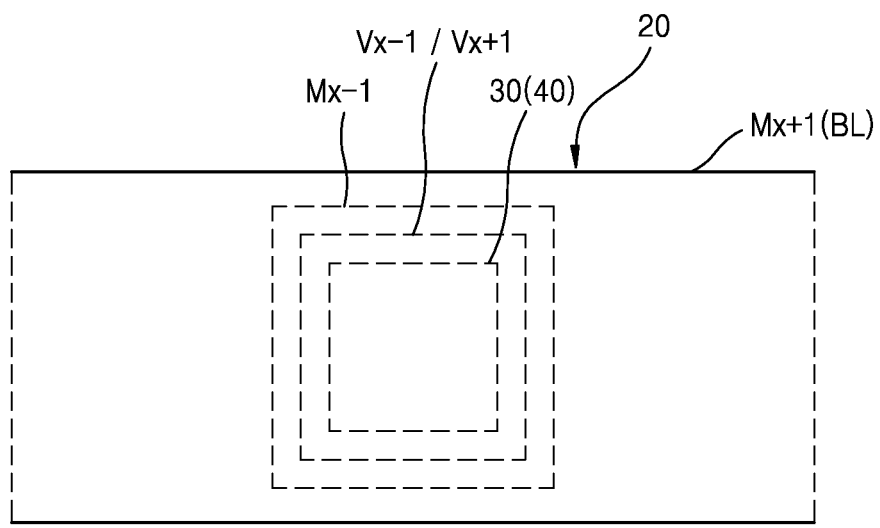
FIG. 3 is a plan view of a semiconductor apparatus according to example embodiments of inventive concepts.

FIG. 3 is a plan view of a semiconductor apparatus according to example embodiments of inventive concepts.

Referring to FIGS. 2B and 3, the variable resistance structure 40, e.g., the magnetoresistive device 30, may overlap the via plug Vx−1 of the first interconnection structure MLSx−1 and the via plug Vx+1 of the second interconnection structure MLSx+1 in a direction perpendicular to the main surface of the substrate 100. In addition, the variable resistance structure 40 may overlap the interconnection layer Mx−1 of the first interconnection structure MLSx−1 and the interconnection layer Mx+1 of the second interconnection structure MLSx+1 in a direction perpendicular to the main surface of the substrate 100.

In example embodiments of inventive concepts, the variable resistance structure 40 may completely overlap the via plug Vx−1 of the first interconnection structure MLSx−1 and the via plug Vx+1 of the second interconnection structure MLSx+1 in a direction perpendicular to the main surface of the substrate 100. In addition, in example embodiments of inventive concepts, the variable resistance structure 40 may completely overlap the interconnection layer Mx−1 of the first interconnection structure MLSx−1 and the interconnection layer Mx+1 of the second interconnection structure MLSx+1 in a direction perpendicular to the main surface of the substrate 100.

The via plug Vx−1 of the first interconnection structure MLSx−1 and the via plug Vx+1 of the second interconnection structure MLSx+1 may overlap the interconnection layer Mx−1 of the first interconnection structure MLSx−1 and the interconnection layer Mx+1 of the second interconnection structure MLSx+1 in a direction perpendicular to the main surface of the substrate 100.

In FIG. 3, the via plug Vx−1 of the first interconnection structure MLSx−1 and the via plug Vx+1 of the second interconnection structure MLSx+1 are illustrated having the same area so as to completely overlap each other, and the interconnection layer Mx+1 of the second interconnection structure MLSx+1 is illustrated as having a larger width than the interconnection layer Mx−1 of the first interconnection structure MLSx−1 (e.g., in a vertical direction in FIG. 3). However, the areas of the elements illustrated in FIG. 3 are for relative comparison with reference to the variable resistance structure 40 and are not limited thereto.

Since the variable resistance structure 40 is disposed to overlap the first and second interconnection structures MLSx−1 and MLSx+1 connecting the upper and lower portions of the variable resistance structure 40, it is possible to significantly reduce the area occupied by one memory cell including the variable resistance structure 40 and to increase the integration degree of the semiconductor apparatus including a plurality of memory cells.

Figure 4:
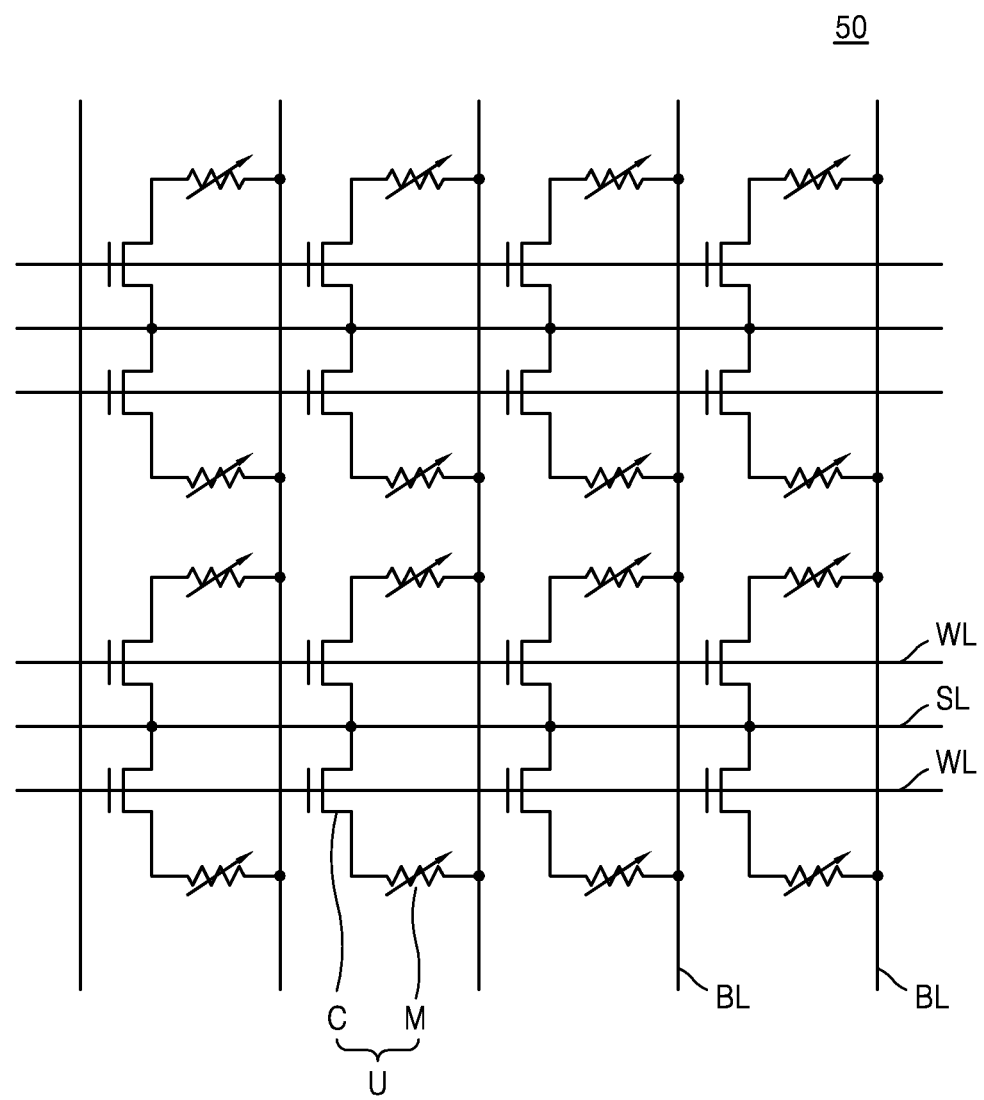
FIG. 4 is a circuit diagram of a memory cell array of a magnetic device included in a semiconductor apparatus, according to example embodiments of inventive concepts.

FIG. 4 is a circuit diagram of a memory cell array of a magnetic device 50 included in a semiconductor apparatus, according to example embodiments of inventive concepts.

Referring to FIG. 4, the memory cell array of the magnetic device 50 may include a plurality of unit cells U arranged in a matrix form. Each of the plurality of unit cells U may include an access unit C and a memory unit M. Each of the plurality of unit cells U may be electrically connected to a word line WL and a bit line BL. A plurality of word lines WL arranged in parallel to one another and a plurality of bit lines BL arranged in parallel to one another may be two-dimensionally arranged to intersect with one another. In example embodiments of inventive concepts, the access unit C may include a transistor. The plurality of unit cells U may correspond to the memory cell 20 of the magnetic device 10 illustrated in FIGS. 2A and 2B.

A source region of the access unit C may be connected to a source line SL. The access unit C may control a current supply to the memory unit M according to a voltage of the word line WL. The access unit C may correspond to the cell transistor CT of the magnetic device 10 illustrated in FIGS. 2A and 2B. In example embodiments of inventive concepts, the access unit C may be a metal-oxide semiconductor (MOS) transistor, a bipolar transistor, or a diode. The source region may correspond to the second source/drain region 100b illustrated in FIG. 2B.

The plurality of source lines SL may be arranged in parallel to one another. The plurality of source lines SL may extend in substantially the same direction as the plurality of word lines WL. However, inventive concepts are not limited thereto. For example, the plurality of source lines SL may extend in substantially the same direction as the plurality of bit lines BL.

The memory unit M may include a magnetic material. In example embodiments of inventive concepts, the memory unit M may include the magnetoresistive device 30 illustrated in FIGS. 2A and 2B. In example embodiments of inventive concepts, the memory unit M may perform a memory function by using a STT phenomenon that a magnetization direction of a magnetic material is changed by an input current.

Figure 5:
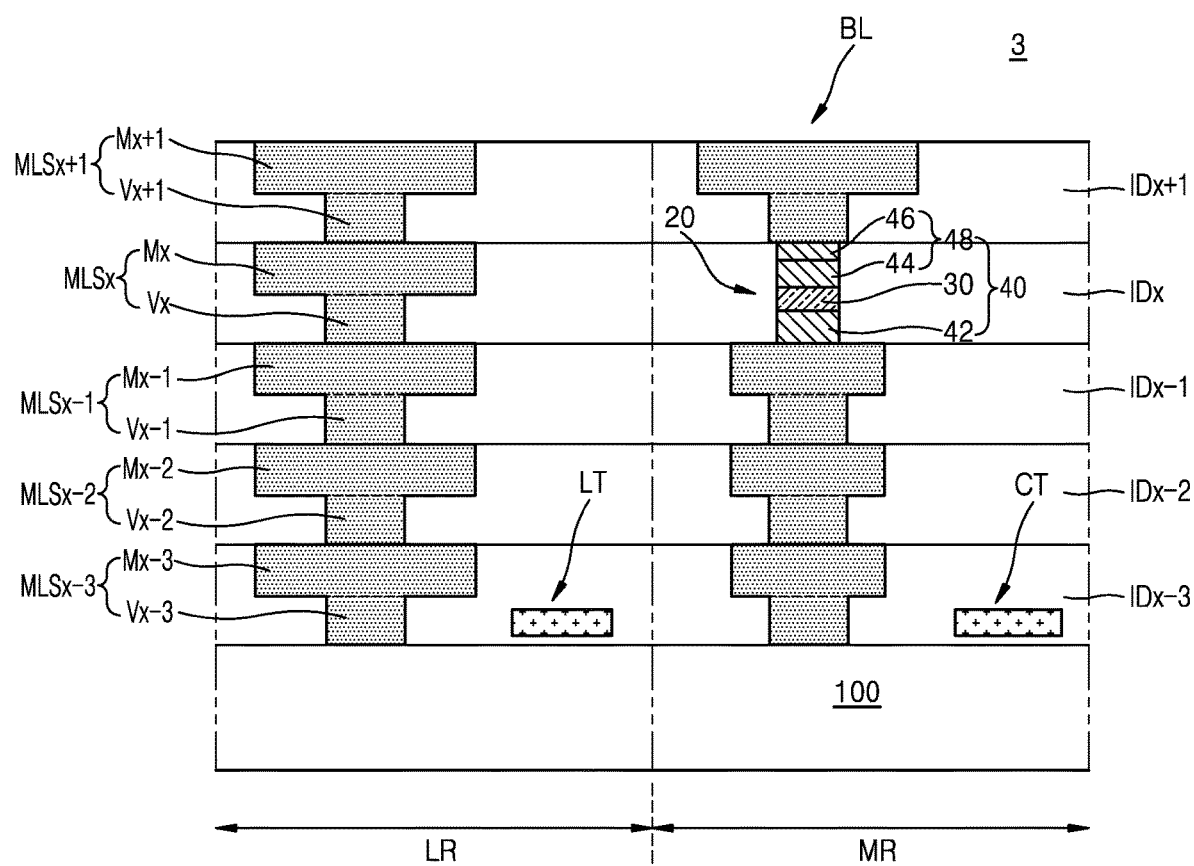
FIG. 5 is a cross-sectional view of a semiconductor apparatus according to example embodiments of inventive concepts.

FIG. 5 is a cross-sectional view of a semiconductor apparatus 3 according to example embodiments of inventive concepts. In the following, descriptions redundant to those of FIGS. 1 to 4 will not be repeated. A memory region MR of the semiconductor apparatus 3 illustrated in FIG. 5 may have substantially the same configuration as the magnetic device 10 illustrated in FIG. 2B, but some elements may be omitted for convenience of illustration.

Referring to FIG. 5, the semiconductor apparatus 3 may include a substrate 100 having a logic region LR and the memory region MR. The semiconductor apparatus 3 may include a logic device LT formed in the logic region LR and a memory cell 20 formed in the memory region MR. The logic device LT may be variously configured by a diode, a transistor, or the like. The memory cell 20 may include a magnetoresistive device 30 and a cell transistor CT. One electrode of the cell transistor CT may be connected to the bit line BL through the magnetoresistive device 30.

A plurality of insulating layers IDx−3, IDx−2, IDx−1, IDx, and IDx+1 may be sequentially stacked on the substrate 100. Interconnection structures MLSx−3, MLSx−2, MLSx−1, MLSx, and MLSx+1 may be respectively formed in the plurality of insulating layers IDx−3, IDx−2, IDx−1, IDx, and IDx+1. For example, the first interconnection structure MLSx−1 may be formed in the first insulating layer IDx−3, the second interconnection structure MLSx−2 may be formed in the second insulating layer IDx−2, the third interconnection structure MLSx−1 may be formed in the third insulating layer IDx−1, the fourth interconnection structure MLSx may be formed in the fourth interconnection structure MLSx, and the fifth interconnection structure MLSx+1 may be formed in the fifth insulating layer IDx+1. The first to fifth interconnection structures MLSx−3, MLSx−2, MLSx−1, MLSx, and MLSx+1 may pass through the first to fifth insulating layers IDx−3, IDx−2, IDx−1, IDx, and IDx+1, respectively. All or part of the first to fifth interconnection structures MLSx−3, MLSx−2, MLSx−1, MLSx, and MLSx+1 may be formed by a dual damascene process.

The first to fifth interconnection structures MLSx−3, MLSx−2, MLSx−1, MLSx, and MLSx+1 may respectively include via plugs Vx−3, Vx−2, Vx−1, Vx, and Vx+1 and interconnection layers Mx−3, Mx−2, Mx−1, Mx, and Mx+1 disposed on the via plugs Vx−3, Vx−2, Vx−1, Vx, and Vx+1.

All or part of the first to fifth interconnection structures MLSx−3, MLSx−2, MLSx−1, MLSx, and MLSx+1 may be formed by a dual damascene process. Therefore, in all or part of the first to fifth interconnection structures MLSx−3, MLSx−2, MLSx−1, MLSx, and MLSx+1, the via plugs Vx−3, Vx−2, Vx−1, Vx, and Vx+1 and the interconnection layers Mx−3, Mx−2, Mx−1, Mx, and Mx+1 may be integrally formed by using a conductive material including a metal.

The fourth interconnection structure MLSx may be formed in the fourth insulating layer IDx of the logic region LR, and may not be formed in the fourth insulating layer IDx of the memory region MR. A variable resistance structure 40 including the magnetoresistive device 30 may be formed in the fourth insulating layer IDx of the memory region MR. The variable resistance structure 40 may include a lower electrode 42, the magnetoresistive device 30, and an upper electrode 48, which are sequentially stacked. The upper electrode 48 may include a first upper electrode 44 and a second upper electrode 46.

The lower electrode 42 and the upper electrode 48 of the variable resistance structure 40 may be connected to the third interconnection structure MLSx−1 of the third insulating layer IDx−1 and the fifth interconnection structure MLSx+1 of the fifth insulating layer IDx+1, respectively.

The magnetoresistive device 30 included in the variable resistance structure 40 may have a relatively complicated structure so as to perform a memory function. Thus, a thickness of the magnetoresistive device 30 may relatively increase. Alternatively, since the variable resistance structure 40 includes a magnetic material, patterning may be relatively difficult. Thus, increasing a thickness of a hard mask for patterning may be done. A portion of the hard mask left after the patterning may remain as a portion of the upper electrode 48, for example, the second upper electrode 46.

Therefore, as the integration degree of the semiconductor apparatus 3 has increased and a design rule has shrunk, a reduction in a height of the variable resistance structure 40 may be limited even when a height of each of the plurality of insulating layers IDx−3, IDx−2, IDx−1, IDx, and IDx+1 is reduced.

In the semiconductor apparatus 3 according to example embodiments of inventive concepts, the variable resistance structure 40 may not be disposed between one interconnection structure and another interconnection structure disposed directly above the interconnection structure, for example, between the third interconnection structure MLSx−1 and the fourth interconnection structure MLSx or between the fourth interconnection structure MLSx and the fifth interconnection structure MLSx+1, and may be disposed between one interconnection structure and another interconnection structure disposed above two or more layers from the interconnection structure, for example, between the third interconnection structure MLSx−1 and the fifth interconnection structure MLSx+1. Therefore, a height space for forming the variable resistance structure 40 may be ensured without increasing the height of the fourth insulating layer IDx in which the variable resistance structure 40 is formed. Accordingly, since a resistance and a parasitic capacitance between the fourth interconnection structure MLSx and the fifth interconnection structure MLSx+1 are not changed, circuit characteristics of the logic devices LT formed in the logic region LR may not be affected. Therefore, it is possible to maintain characteristics of IPs having the logic devices LT disposed in the logic region LR, thus shortening the product development time of the embedded semiconductor apparatuses.

Figure 6:
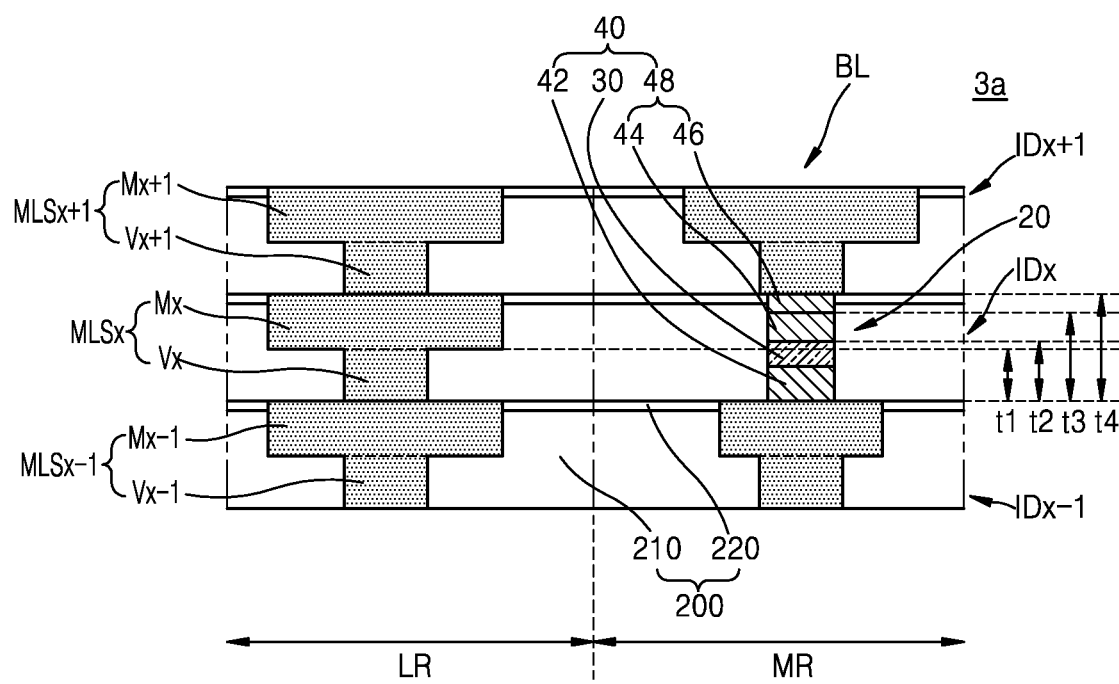
FIG. 6 is a cross-sectional view of a semiconductor apparatus according to example embodiments of inventive concepts.

FIG. 6 is a cross-sectional view of a semiconductor apparatus 3a according to example embodiments of inventive concepts. In the following, descriptions redundant to those of FIG. 5 will not be repeated.

Referring to FIG. 6, the semiconductor apparatus 3a may include a first insulating layer IDx−1 formed in a logic region LR and a memory region MR, a second insulating layer IDx+1 formed on the first insulating layer IDx−1, and a base insulating layer IDx formed between the first insulating layer IDx−1 and the second insulating layer IDx+1.

A first interconnection structure MLSx−1 and a second interconnection structure MLSx+1 respectively passing through the first insulating layer IDx−1 and the second interconnection layer IDx+1 may be formed in each of the logic region LR and the memory region MR.

A base interconnection structure MLSx passing through the base insulating layer IDx may be formed in the logic region LR, and a variable resistance structure 40 inside the base insulating layer IDx may be formed in the memory region MR. The base interconnection structure MLSx may be formed in the base insulating layer IDx of the logic region LR and may not be formed in the base insulating layer IDx of the memory region MR. The base interconnection structure MLSx of the logic region LR may electrically connect the first interconnection structure MLSx−1 to the second interconnection structure MLSx+1.

In example embodiments of inventive concepts, each of the first insulating layer IDx−1, the base insulating layer IDx, and the second insulating layer IDx+1 may include a multilayer insulating film 200. The multilayer insulating film 200 may include a base insulating layer 210 and a capping insulating layer 220 covering the base insulating layer 210. The base insulating layer 210 may include an oxide film or a low-k dielectric film having a lower dielectric constant than a silicon oxide film. The low-k dielectric film may be a SiOC film or a SiCOH film. The capping insulating layer 220 may be a SiC film or a SiN film. The capping insulating layer 220 may be used as a diffusion barrier layer with respect to a metal material included in the first interconnection structure MLSx−1, the base interconnection structure MLSx, or the second interconnection structure MLSx+1. For example, the first interconnection structure MLSx−1, the base interconnection structure MLSx, or the second interconnection structure MLSx+1 may be formed by a dual damascene process. Therefore, after an auxiliary interconnection material layer is formed to cover the first insulating layer IDx−1, the base insulating layer IDx, or the second insulating layer IDx+1, the first interconnection structure MLSx−1, the base interconnection structure MLSx, or the second interconnection structure MLSx+1 may be formed by a planarization process such as a chemical mechanical polishing (CMP). At this time, the capping insulating layer 220 may limit (and/or prevent) a metal material included in the auxiliary interconnection material layer from diffusing into the first insulating layer IDx−1, the base insulating layer IDx, or the second insulating layer IDx+1.

The bottom surface of the lower electrode 42 of the variable resistance structure 40 may have substantially the same level as the bottom surface of the base insulating layer IDx from the main surface of the substrate (100 of FIG. 5), and the top surface of the upper electrode 48 may have the same level as the top surface of the base insulating layer IDx. In addition, the top surface of the first interconnection layer IDx−1 may have substantially the same level as the bottom surface of the lower electrode 42 of the variable resistance structure 40, and the bottom surface of the second interconnection layer IDx+1 may have substantially the same as the top surface of the upper electrode 48.

A second height t2, which is a height from the top surface of the first insulating layer IDx−1 to the top surface of the magnetoresistive device 30, may be greater than a first height t1, which is a height from the top surface of the first insulating layer IDx−1 to the top surface of the via plug Vx of the base interconnection structure MLSx. A third height t3, which is a height from the top surface of the first insulating layer IDx−1 to the top surface of the first upper electrode 44, may be greater than the first height t1. The height of the base insulating layer IDx, the height of the base interconnection structure MLSx, and the height of the variable resistance structure 40 may have substantially the same height as a fourth height t4.

Therefore, the top surface of the upper electrode 48 of the variable resistance structure 40 may have substantially the same level as the top surface of the interconnection layer Mx of the base interconnection structure MLSx in the logic region LR, and the bottom surface of the lower electrode 42 of the variable resistance structure 40 may have substantially the same level as the bottom surface of the via plug Vx of the base interconnection structure MLSx in the logic region LR.

Therefore, the magnetoresistive device 30 of the semiconductor apparatus 3a may be formed to have a relatively thick thickness, thus improving the memory function of the magnetoresistive device 30.

Figure 7:
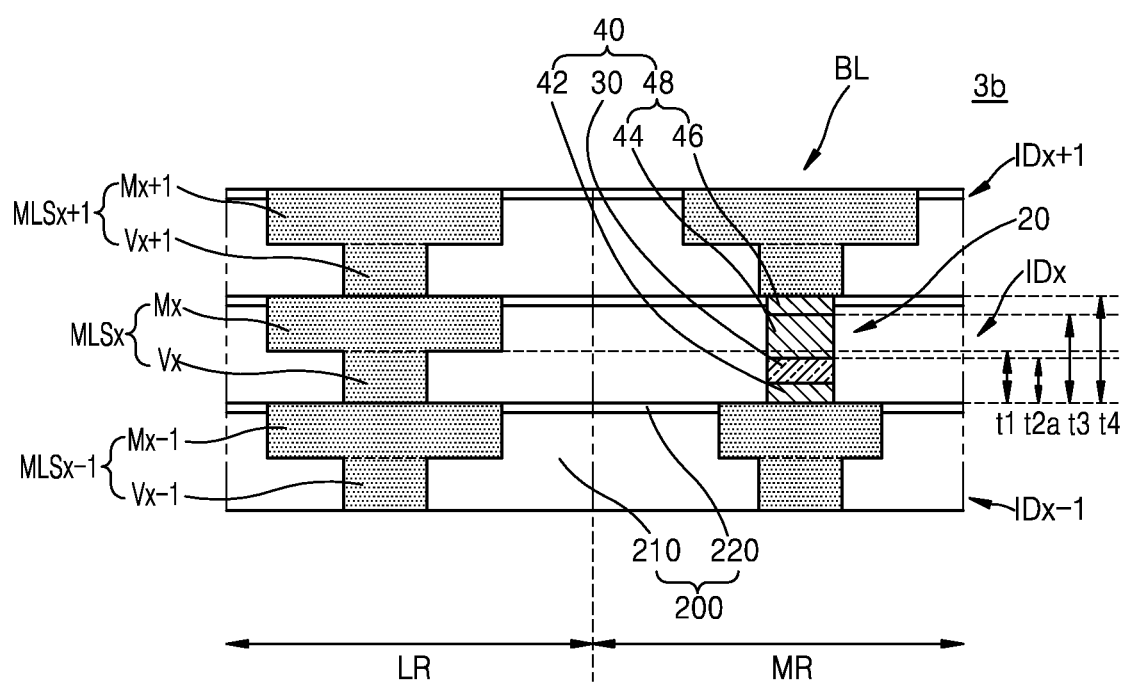
FIG. 7 is a cross-sectional view of a semiconductor apparatus according to example embodiments of inventive concepts.

FIG. 7 is a cross-sectional view of a semiconductor apparatus 3b according to example embodiments of inventive concepts. In the following, descriptions redundant to those of FIGS. 5 and 6 will not be repeated.

Referring to FIG. 7, the semiconductor apparatus 3b may include a first insulating layer IDx−1 formed in a logic region LR and a memory region MR, a second insulating layer IDx+1 formed on the first insulating layer IDx−1, and a base insulating layer IDx formed between the first insulating layer IDx−1 and the second insulating layer IDx+1.

A first interconnection structure MLSx−1 and a second interconnection structure MLSx+1 respectively passing through the first insulating layer IDx−1 and the second insulating layer IDx+1 may be formed in each of the logic region LR and the memory region MR.

A base interconnection structure MLSx passing through the base insulating layer IDx may be formed in the logic region LR, and a variable resistance structure 40 inside the base insulating layer IDx may be formed in the memory region MR. The base interconnection structure MLSx may be formed in the base insulating layer IDx of the logic region LR and may not be formed in the base insulating layer IDx of the memory region MR.

A second height t2a, which is a height from the top surface of the first insulating layer IDx−1 to the top surface of the magnetoresistive device 30, may be less than a first height t1, which is a height from the top surface of the first insulating layer IDx−1 to the top surface of the via plug Vx of the base interconnection structure MLSx. A third height t3, which is a height from the top surface of the first insulating layer IDx−1 to the top surface of the first upper electrode 44, may be greater than the first height t1. The height of the base insulating layer IDx, the height of the base interconnection structure MLSx, and the height of the variable resistance structure 40 may have substantially the same height as a fourth height t4.

Therefore, the upper electrode 48 of the semiconductor apparatus 3b may be formed to have a relatively thick thickness, thus facilitating the patterning of the variable resistance structure 40 and improving reliability of the magnetoresistive device 30.

FIGS. 8 to 12 are cross-sectional views of variable resistance structures included in a semiconductor apparatus, according to various example embodiments of inventive concepts. In FIGS. 8 to 12, the same reference numerals as those used in FIGS. 2, 5, 6, and 7 refer to the same members, and detailed descriptions thereof will not be repeated.

Figure 8:
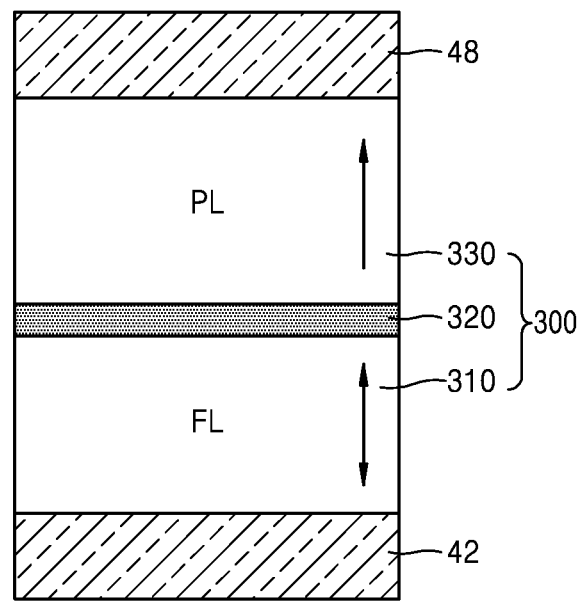
FIGS. 8 to 12 are cross-sectional views of variable resistance structures included in a semiconductor apparatus, according to example embodiments of inventive concepts.

Referring to FIG. 8, the semiconductor apparatus may include a variable resistance structure 40A including a magnetoresistive device 300.

In example embodiments of inventive concepts, the magnetoresistive device 300 and the variable resistance structure 40A illustrated in FIG. 8 may constitute the magnetoresistive devices 30 and the variable resistance structures 40 illustrated in FIGS. 2B, 3, 5, 6, and 7.

The variable resistance structure 40A may include the magnetoresistive device 300 disposed between a lower electrode 42 and an upper electrode 48. The magnetoresistive device 300 may include a free layer (FL) 310, a pinned layer (PL) 330, and a tunnel barrier layer 320 disposed between the free layer 310 and the pinned layer 330.

The free layer 310 may have a magnetization easy axis in a direction perpendicular to a film surface constituting the free layer 310, and a magnetization direction thereof may be variable according to a condition. The pinned layer 330 may have a magnetization easy axis in a direction perpendicular to a film surface constituting the pinned layer 330, and a magnetization direction thereof may be fixed. A resistance of the magnetoresistive device 300 may be changed according to the magnetization direction of the free layer 310. When the magnetization direction of the free layer 310 is parallel to the magnetization direction of the pinned layer 330, the magnetoresistive device 300 may have a low resistance and store data "0". When the magnetization direction of the free layer 310 is antiparallel to the magnetization direction of the pinned layer 330, the magnetoresistive device 300 may have a high resistance and store data "1". The positions of the free layer 310 and the pinned layer 330 are limited to the example of FIG. 8, and the free layer 310 may exchange positions with the pinned layer 330. Alternatively, data stored in the magnetoresistive device 300 may be reversed according to the magnetization direction of the free layer 310.

The free layer 310 and the pinned layer 330 may have an interface perpendicular magnetic anisotropy (IPMA) in the interface (e.g., contact surface) with the tunnel barrier layer 320.

To this end, the free layer 310 and the pinned layer 330 may include a ferromagnetic material. The ferromagnetic material may have a relatively high magnetic anisotropy energy (Ku) of about 106 erg/cc to about 107 erg/cc. The free layer 310 and the pinned layer 330 may have a magnetization easy axis perpendicular to the interface due to the relatively high magnetic anisotropy energy.

The free layer 310 may be a magnetic layer having a variable magnetization direction. That is, the free layer 310 may include a ferromagnetic material having a magnetic moment, whose magnetization direction is changed freely with respect to a direction perpendicular to a layer surface. For example, the ferromagnetic material may include at least one of Co, Fe, and Ni and may further include other element such as B, Cr, Pt, and Pd. The free layer 310 may include a material different from the pinned layer 330, or may be include substantially the same material as the pinned layer 330.

The pinned layer 330 may be a magnetic layer having a fixed magnetization direction. The ferromagnetic material of the pinned layer 330 may include at least one of Co, Fe, and Ni and may further include another element such as B, Cr, Pt, and Pd.

In example embodiments of inventive concepts, the pinned layer 330 is illustrated as one single layer, but inventive concepts are not limited thereto. For example, the pinned layer 330 may have a multilayer structure.

In example embodiments of inventive concepts, the pinned layer 330 may have a multilayer structure in which a first layer including at least one of Co and a Co alloy and a second layer including at least one of Pt, Ni, and Pd are alternately stacked. Alternatively, the pinned layer 330 may be a FePt layer or a CoPt layer having a L10 structure, or may be an alloy layer of a rare-earth element and a transition metal. The rare-earth element may be at least one of Tb and Gd, and the transition metal may be at least one of Ni, Fe, and Co. Alloys of various combinations of the rare-earth element and the transition metal may be used. For example, CoFeB or CoFe may be used as the material of the pinned layer 330.

In order to increase a TMR of the magnetoresistive device 300, the tunnel barrier layer 320 may be disposed between the free layer 310 and the pinned layer 330. The tunnel barrier layer 320 may have a thickness of about 8 Å to about 15 Å. The tunnel barrier layer 320 may be thinner than a spin diffusion distance. The tunnel barrier layer 320 may include a non-magnetic material. The tunnel barrier layer 320 may include at least one of oxides of Mg, Ti, Al, MaZn, and MgB and nitrides of Ti and V. The tunnel barrier layer 320 may have a multilayer structure.

In example embodiments of inventive concepts, the free layer 310, the tunnel barrier layer 320, and the pinned layer 330 may have substantially the same crystal structure. For example, each of the free layer 310, the tunnel barrier layer 320, and the pinned layer 330 may have a body centered cubic (BCC) crystal structure.

Figure 9:
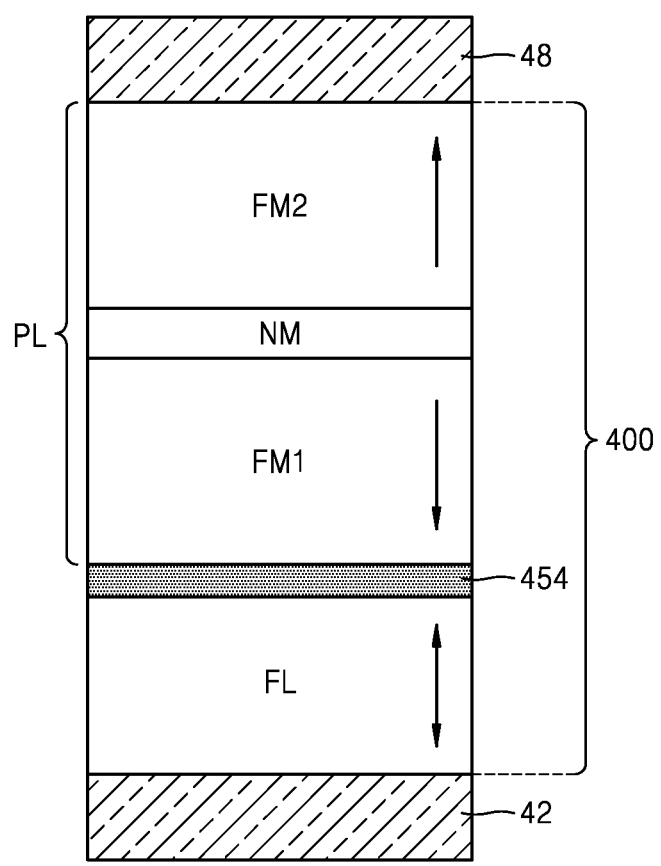

Referring to FIG. 9, a semiconductor apparatus according to example embodiments of inventive concepts may include a variable resistance structure 40B including a magnetoresistive device 400.

In example embodiments of inventive concepts, the magnetoresistive device 400 and the variable resistance structure 40B illustrated in FIG. 9 may constitute the magnetoresistive devices 30 and the variable resistance structures 40 illustrated in FIGS. 2B, 3, 5, 6, and 7.

The variable resistance structure 40B may include the magnetoresistive device 400 disposed between a lower electrode 42 and an upper electrode 48. The magnetoresistive device 400 may include a free layer FL, a pinned layer PL having a synthetic antiferromagnets (SAF) structure, and a tunnel barrier layer 454 disposed therebetween.

The pinned layer PL may include two ferromagnetic layers FM1 and FM2 separated from each other by a thin non-magnetic layer NM. Antiferromagnetic coupling characteristics may appear in the SAF structure by Ruderman-Kittel-Kasuya-Yosida (RKKY) interaction caused by the thin non-magnetic layer NM inserted between the two ferromagnetic layers FM1 and FM2. Due to the antiferromagnetic coupling acting between the two ferromagnetic layers FM1 and FM2, magnetic domains of the ferromagnetic layers FM1 and FM2 may be aligned in opposite directions, thus minimizing the entire magnetization amount of the SAF structure.

When an external magnetic field applied to the free layer FL gradually increases and reaches a switching field, which is a threshold value of magnetization reversal, an electrical resistance may instantaneously change due to the magnetization reversal phenomenon.

In example embodiments of inventive concepts, the ferromagnetic layers FM1 and FM2 may include CoFeB, CoFe, NiFe, FePt, or CoPt. The thin non-magnetic layer NM may include one of Ru, Cr, Pt, Pd, Jr, Rh, Ru, Os, Re, Au, and Cu, or may include an alloy of Ru, Cr, Pt, Pd, Jr, Rh, Ru, Os, Re, Au, or Cu.

Figure 10:
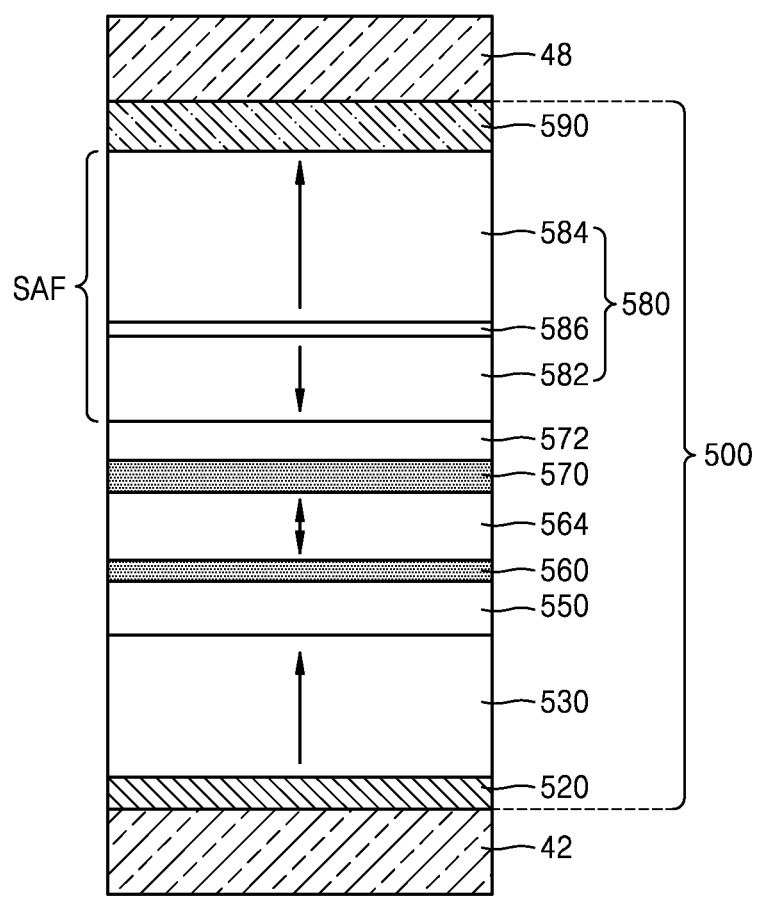

Referring to FIG. 10, a semiconductor apparatus according to example embodiments of inventive concepts may include a variable resistance structure 40C including a magnetoresistive device 500.

In example embodiments of inventive concepts, the magnetoresistive device 500 and the variable resistance structure 40C illustrated in FIG. 10 may constitute the magnetoresistive devices 30 and the variable resistance structures 40 illustrated in FIGS. 2B, 3, 5, 6, and 7.

The variable resistance structure 40C may include the magnetoresistive device 500 disposed between a lower electrode 42 and an upper electrode 48. The magnetoresistive device 500 may include a seed layer 520 formed on the lower electrode 42, and a lower pinned layer 530 formed on the seed layer 520. The seed layer 520 may include Ru, Pt, or Pd.

In example embodiments of inventive concepts, a buffer layer (not illustrated) may be disposed between the lower electrode 42 and the seed layer 520. The buffer layer may match a crystal structure of the lower electrode 42 and a crystal structure of the seed layer 520 between the lower electrode 42 and the seed layer 520. The buffer layer may include Ta.

The lower pinned layer 530 may provide stable switching characteristics by offsetting a leakage magnetic field in an upper pinned layer 580 having a SAF structure. The lower pinned layer 530 may have a magnetization easy axis in a direction perpendicular to a surface contacting the seed layer 520. In the lower pinned layer 530, the magnetization direction is not changed. In FIG. 10, the magnetization direction of the lower pinned layer 530 is illustrated as being a direction opposite to the lower electrode 42, e.g., a direction directed toward the upper pinned layer 580, but is not limited thereto. The magnetization direction of the lower pinned layer 530 may be directed toward the lower electrode 42.

In example embodiments of inventive concepts, the lower pinned layer 530 may include a Co-based vertical pinned layer. For example, the lower pinned layer 530 may have a [Co/Pt]xn stack structure (where n is the number of times of repetition) in which a Co film having a thickness of about 1 Å to about 5 Å and a Pt film having a thickness of about 1 Å to about 5 Å are alternately stacked twice or more times. In example embodiments of inventive concepts, the lower pinned layer 530 may have a [Co/Pd]xn stack structure (where n is the number of times of repetition) in which a Co film having a thickness of about 1 Å to about 5 Å and a Pd film having a thickness of about 1 Å to about 5 Å are alternately stacked twice or more times.

The lower pinned layer 530 may be formed by an ultra-thin epitaxial growth process based on solid phase epitaxy. For example, the lower pinned layer 530 may be formed by a molecular beam epitaxy (MBE) process or a metal organic CVD (MOCVD) process. The lower pinned layer 530 may be formed at a relatively low temperature of about 200° C. to about 400° C. For example, the lower pinned layer 530 may be formed at a temperature of about 300° C. The lower pinned layer 530 may have a thickness of about 20 Å to about 30 Å.

A first polarization reinforcement layer 550 may be formed on the lower pinned layer 530 so as to increase spin polarization in the lower pinned layer 530. The first polarization reinforcement layer 550 may include a CoFeB magnetic layer. The first polarization reinforcement layer 550 may have substantially the same polarization direction as the lower pinned layer 530. The first polarization reinforcement layer 550 may have a thickness of about 10 Å to about 20 Å. In example embodiments of inventive concepts, the first polarization reinforcement layer 550 may be omitted.

A first tunnel barrier layer 560 may be formed on the first polarization reinforcement layer 550, and a free layer 564 having a variable magnetization direction may be formed on the first tunnel barrier layer 560. A second tunnel barrier layer 570 may be formed on the free layer 564, and the upper pinned layer 580 may be formed on the second tunnel barrier layer 570.

The first tunnel barrier layer 560 and the second tunnel barrier layer 570 may include a non-magnetic material. In example embodiments of inventive concepts, each of the first tunnel barrier layer 560 and the second tunnel barrier layer 570 may include an oxide of one material selected from Mg, Ti, Al, MgZn, and MgB. In example embodiments of inventive concepts, each of the first tunnel barrier layer 560 and the second tunnel barrier layer 570 may include Ti nitride or V nitride. In example embodiments of inventive concepts, at least one of the first tunnel barrier layer 560 and the second tunnel barrier layer 570 may be a single layer. In example embodiments of inventive concepts, at least one of the first tunnel barrier layer 560 and the second tunnel barrier layer 570 may be a multilayer including a plurality of layers. For example, at least one of the first tunnel barrier layer 560 and the second tunnel barrier layer 570 may have a multilayer structure selected from Mg/MgO, MgO/Mg, and Mg/MgO/Mg. In example embodiments of inventive concepts, the second tunnel barrier layer 570 may be thicker than the first tunnel barrier layer 560.

The magnetoresistive device 500 of the variable resistance structure 40C illustrated in FIG. 10 may have a dual MTJ structure including the first tunnel barrier layer 560 and the second tunnel barrier layer 570. When current is supplied through the dual MTJ structure including the first tunnel barrier layer 560 and the second tunnel barrier layer 570, the free layer 564 may switch between stable magnetic states. Since the magnetoresistive device 500 has the dual MTJ structure, it is possible to provide improved performance in highly integrated magnetic devices. In example embodiments of inventive concepts, the first tunnel barrier layer 560 may be omitted.

A second polarization reinforcement layer 572 may be disposed between the second tunnel barrier layer 570 and the upper pinned layer 580. The second polarization reinforcement layer 572 may include a ferromagnetic material selected from Co, Fe, and Ni. The second polarization reinforcement layer 572 may have a high spin polarizability and a low damping constant. To this end, the second polarization reinforcement layer 572 may further include a non-magnetic material selected from B, Zn, Ru, Ag, Au, Cu, C, or N. In example embodiments of inventive concepts, the second polarization reinforcement layer 572 may include a CoFeB magnetic layer. The second polarization reinforcement layer 572 may have a thickness of about 10 Å to about 20 Å. In example embodiments of inventive concepts, the second polarization reinforcement layer 572 may be omitted.

The upper pinned layer 580 may include a first upper pinned layer 582, a second upper pinned layer 584, and an exchange coupling film 586 disposed therebetween. A magnetic moment of the first upper pinned layer 582 may be antiparallel to a magnetic moment of the lower pinned layer 530. A magnetic moment of the second upper pinned layer 584 may be antiparallel to a magnetic moment of the first upper pinned layer 582.

As in the vertical pinned layer PL described above with reference to FIG. 9, the upper pinned layer 580 may have a SAF structure. At this time, the first upper pinned layer 582 and the second upper pinned layer 584 may correspond to the two ferromagnetic layers FM1 and FM2. The exchange coupling film 586 may correspond to the thin non-magnetic layer NM inserted between the two ferromagnetic layers FM1 and FM2.

The second polarization reinforcement layer 572 may increase spin polarization in the first upper pinned layer 582. The second polarization reinforcement layer 572 may have substantially the same polarization direction as the first upper pinned layer 582.

A capping layer 590 may be formed on the upper pinned layer 580. The capping layer 590 may include at least one material selected from Ru, Ta, Al, Cu, Au, Ag, Ti, TaN, and TiN.

In the magnetoresistive device 500 illustrated in FIG. 10, a resistance of the magnetic device may be changed according to a direction of electrons flowing through the dual MTJ structure. By using a difference in resistance, data may be stored in a memory cell including the magnetoresistive device.

Figure 11:
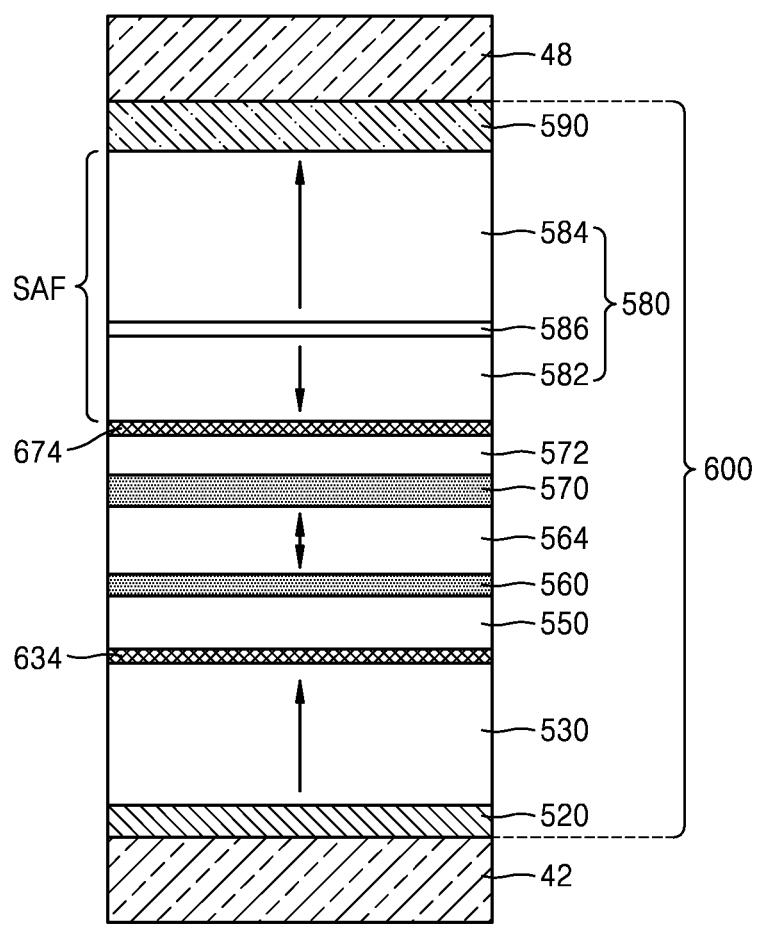

Referring to FIG. 11, a semiconductor apparatus according to example embodiments of inventive concepts may include a variable resistance structure 40D including a magnetoresistive device 600.

In example embodiments of inventive concepts, the magnetoresistive device 600 and the variable resistance structure 40D illustrated in FIG. 11 may constitute the magnetoresistive devices 30 and the variable resistance structures 40 illustrated in FIGS. 2B, 3, 5, 6, and 7.

The magnetoresistive device 600 of the variable resistance structure 40D may have substantially the same structure as the magnetoresistive device 500 of the variable resistance structure 40C illustrated in FIG. 10. However, the magnetoresistive device 600 of the variable resistance structure 40D may further include a first amorphous film 634 disposed between a lower pinned layer 530 and a first polarization reinforcement layer 550, and a second amorphous film 674 disposed between a second polarization reinforcement layer 572 and a first upper pinned layer 582.

In example embodiments of inventive concepts, each of the first amorphous film 634 and the second amorphous film 674 may include Ta. In example embodiments of inventive concepts, each of the first amorphous film 634 and the second amorphous film 674 may have a thickness of about 1 Å to about 6 Å, but inventive concepts are not limited thereto.

Figure 12:
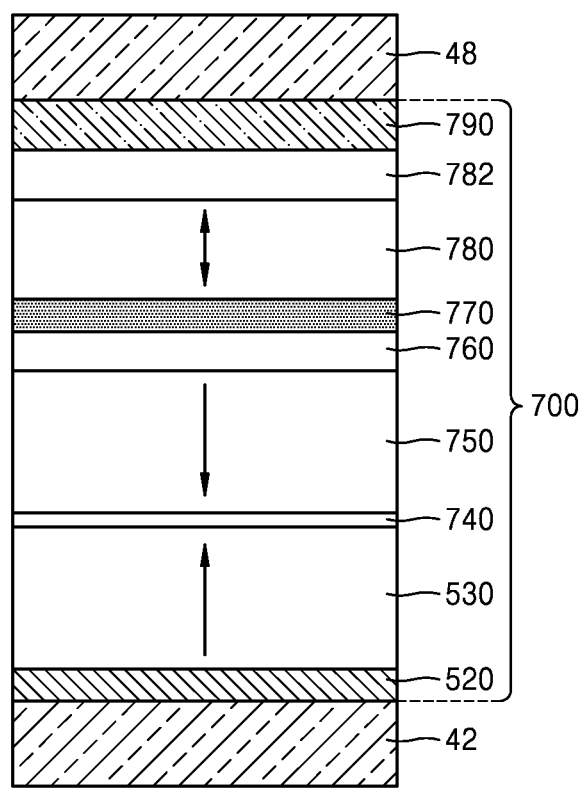

Referring to FIG. 12, a semiconductor apparatus according to example embodiments of inventive concepts may include a variable resistance structure 40E including a magnetoresistive device 700.

In example embodiments of inventive concepts, the magnetoresistive device 700 and the variable resistance structure 40E illustrated in FIG. 11 may constitute the magnetoresistive devices 30 and the variable resistance structures 40 illustrated in FIGS. 2B, 3, 5, 6, and 7.

The magnetoresistive device 700 of the variable resistance structure 40E may include a seed layer 520 formed on a lower electrode 42 as described above with reference to FIG. 10. A lower pinned layer 530 having a perpendicular magnetic anisotropy may be formed on the seed layer 520 An exchange coupling film 740 and an upper pinned layer 750 may be sequentially formed on the lower pinned layer 530. A magnetic moment of the upper pinned layer 750 may be antiparallel to a magnetic moment of the lower pinned layer 530. Detailed configurations of the exchange coupling film 740 and the upper pinned layer 750 are substantially the same as those of the exchange coupling film 586 and the second upper pinned layer 584 described above with reference to FIG. 10.

A polarization reinforcement layer 760, a tunnel barrier layer 770, a free layer 780, a nano-oxide layer (NOL) 782, and a capping layer 790 may be sequentially formed on the upper pinned layer 750.

The polarization reinforcement layer 760 may include a CoFeB magnetic layer. The tunnel barrier layer 770 may include a non-magnetic material. The tunnel barrier layer 770 may have substantially the same structure as the second tunnel barrier layer 570 described above with reference to FIG. 10.

The NOL 782 may include Ta oxide or Mg oxide. In example embodiments of inventive concepts, the NOL 782 may be omitted.

Detailed configurations of the capping layer 790 may be substantially the same as those of the capping layer 590 described above with reference to FIG. 10.

In FIGS. 8 to 12, the magnetoresistive devices 300, 400, 500, 600, and 700 are illustrated as having a magnetization easy axis perpendicular to the film surface of the corresponding layer, but are not limited thereto. The magnetization easy axis may be parallel to the film surface of the corresponding layer.

FIGS. 13A to 13E are cross-sectional views for describing a method of manufacturing a semiconductor apparatus, according to example embodiments of inventive concepts. In example embodiments of inventive concepts, a method of manufacturing the semiconductor apparatus 3 illustrated in FIG. 5 will be described. In FIGS. 13A to 13E, the same reference numerals as those used in FIGS. 1A to 7 refer to the same members, and detailed descriptions thereof will not be repeated.

Figure 13A:
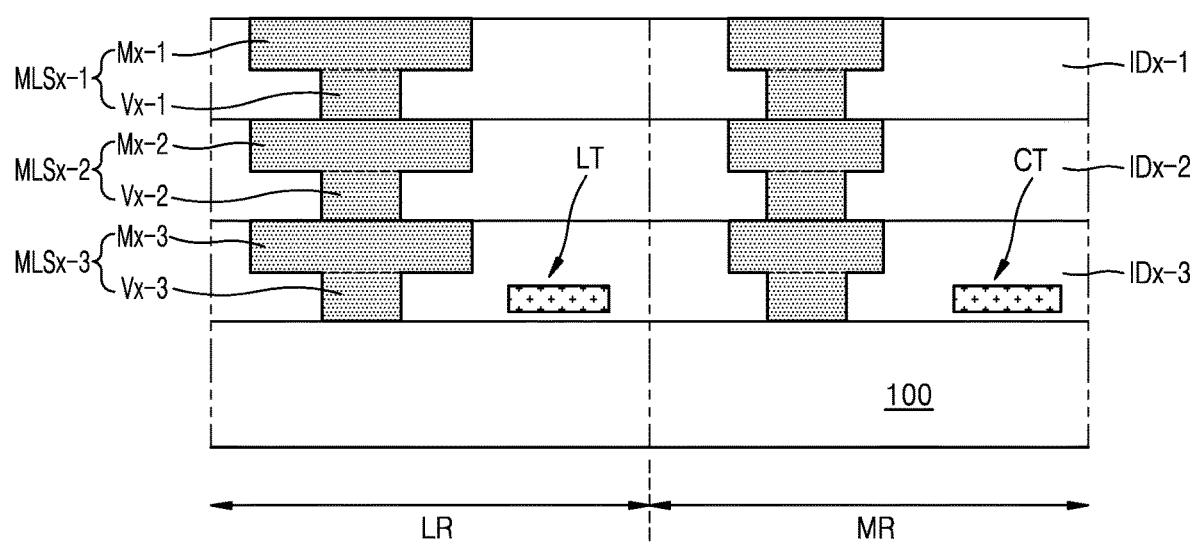
FIGS. 13A to 13E are cross-sectional views for describing a method of manufacturing a semiconductor apparatus, according to example embodiments of inventive concepts.

Referring to FIG. 13A, first to third insulating layers IDx-3, IDx-2, and IDx-1, in which first to third interconnection structures MLSx-3, MLSx-2, and MLSx-1 are formed, may be stacked on a substrate 100 having a logic region LR and a memory region MR. A logic device LT may be formed in the logic region LR and a cell transistor CT may be formed in the memory region MR.

The first to third interconnection structures MLSx-3, MLSx-2, and MLSx-1 may respectively include via plugs Vx-3, Vx-2, and Vx-1 and interconnection layers Mx-3, Mx-2, and Mx-1 disposed on the via plugs Vx-3, Vx-2, and Vx-1. After the first to third insulating layers IDx-3, IDx-2, and IDx-1 are formed, the first to third interconnection structures MLSx-3, MLSx-2, and MLSx-1 may be formed by a dual damascene process. Therefore, the via plugs Vx-3, Vx-2, and Vx-1 and the interconnection layers Mx-3, Mx-2, and Mx-1 respectively constituting the first to third interconnection structures MLSx-3, MLSx-2, and MLSx-1 may be integrally formed by using a first conductive material including a metal. For example, each of the first to third interconnection structures MLSx-3, MLSx-2, and MLSx-1 may be integrally formed by using copper or the first conductive material including copper.

Figure 13B:
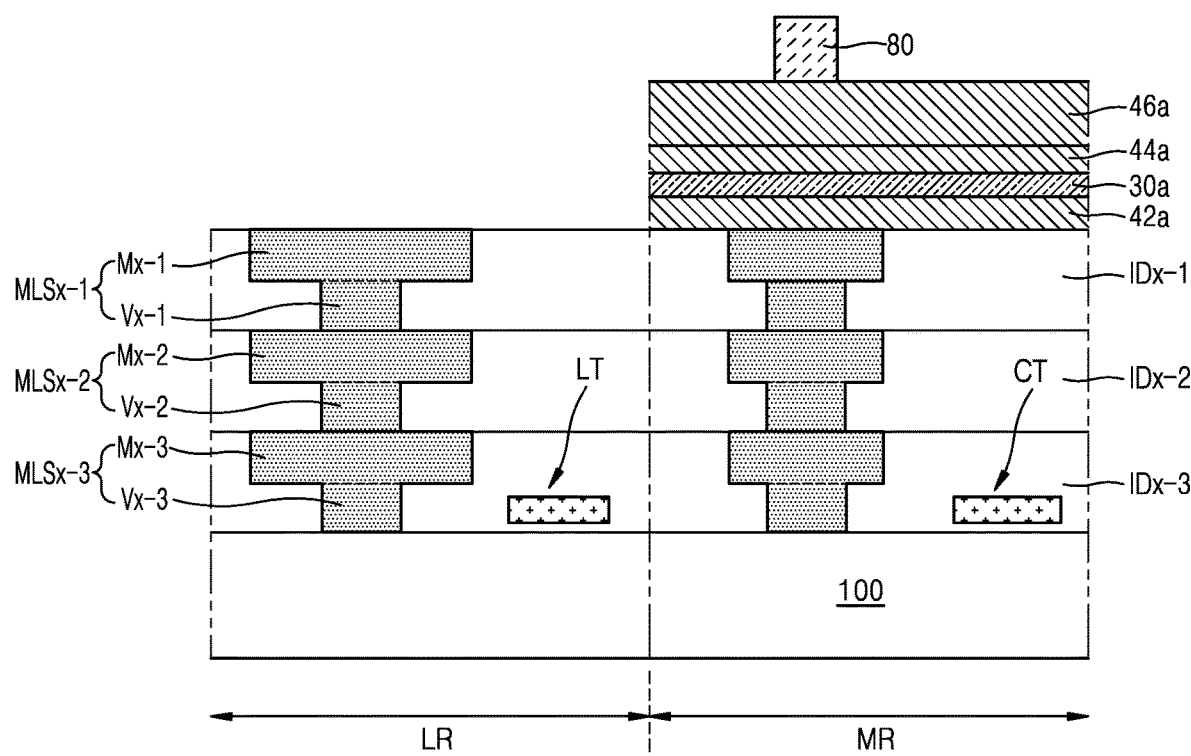

Referring to FIG. 13B, a lower electrode layer 42a, an auxiliary magnetoresistive layer 30a, a first upper electrode layer 44a, and a second upper electrode layer 46a may be sequentially stacked on the third insulating layer IDx-1 of the memory region MR, and a mask pattern 80 may be formed on the second upper electrode layer 46a.

In FIG. 3B, a lower electrode layer 42a, an auxiliary magnetoresistive layer 30a, a first upper electrode layer 44a, and a second upper electrode layer 46a are illustrated as not being formed in the logic region LR, but inventive concepts are not limited thereto. For example, the lower electrode layer 42a, the auxiliary magnetoresistive layer 30a, the first upper electrode layer 44a, and the second upper electrode layer 46a may also be formed in the logic region LR and be completely removed in a subsequent process.

Figure 13C:
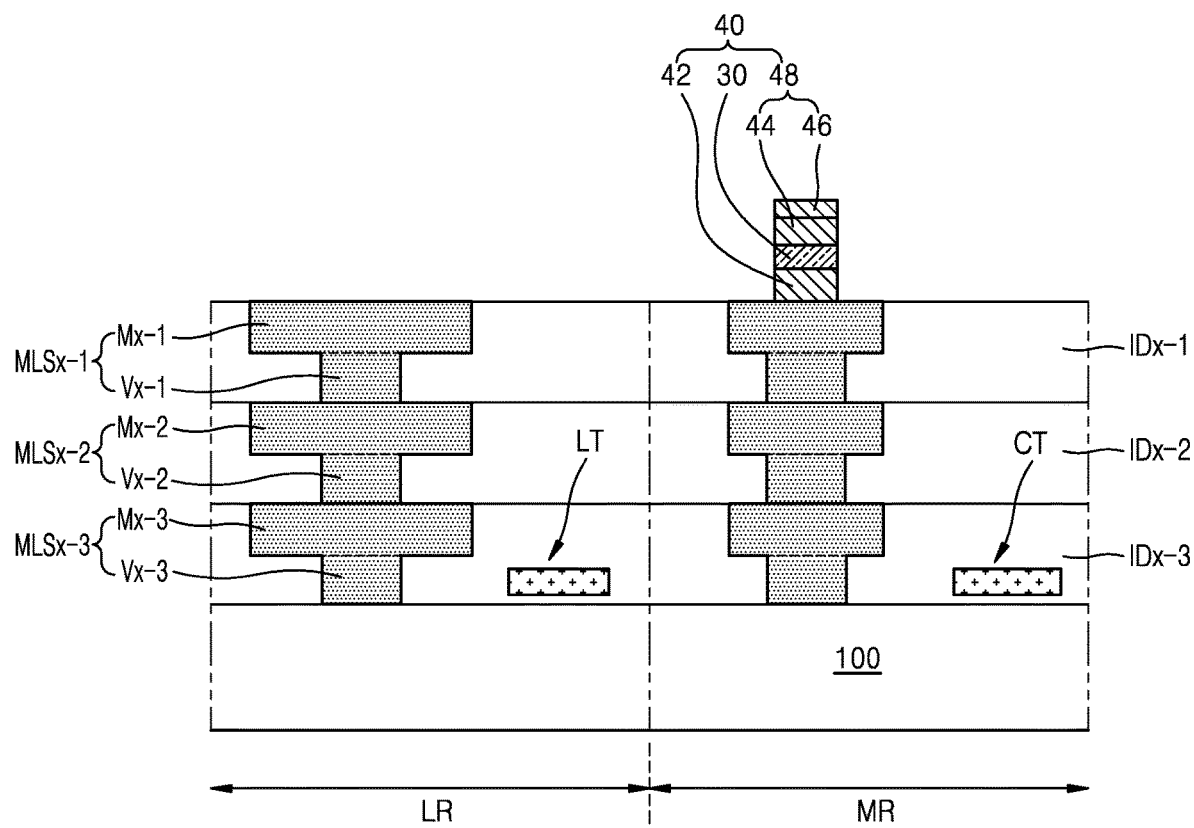

Referring to FIGS. 13B and 13C, a variable resistance structure 40 may be formed by patterning the second upper electrode layer 46a, the first upper electrode layer 44a, the auxiliary magnetoresistive layer 30a, and the lower electrode layer 42a by using the mask pattern 80 as an etching mask.

In example embodiments of inventive concepts, in order to form the variable resistance structure 40, the substrate 100 may be loaded into a plasma etching chamber and a plasma etching process may be performed on the substrate 100. In example embodiments of inventive concepts, a reaction ion etching (RIE) process, an ion beam etching (IBE) process, or an Ar milling processing may be used as the patterning process for forming the variable resistance structure 40. In example embodiments of inventive concepts, the patterning process for forming the variable resistance structure 40 may use a first etching gas. the first etching gas may include one of $SF_6$, $NF_3$, $SiF_4$, $CF_4$, $Cl_2$, $CH_3OH$, $CH_4$, $CO$, $NH_3$, $H_2$, $N_2$, HBr, or combinations thereof. In example embodiments of inventive concepts, the patterning process for forming the variable resistance structure 40 may further use a first additional gas including at least one of Ne, Ar, Kr, and Xe, as well as the first etching gas.

The patterning process for forming the variable resistance structure 40 may be performed by using plasma formed from an inductively coupled plasma (ICP) source, a capacitively coupled plasma (CCP) source, an electron cyclotron resonance (ECR) plasma source, a helicon-wave excited plasma (HWEP) source, or an adaptively coupled plasma (ACP) source.

The patterning process for forming the variable resistance structure 40 may further include an etching process using a second etching gas having a different composition from the first etching gas. The second etching gas may include one of $SF_6$, $NF_3$, $SiF_4$, $CF_4$, $Cl_2$, $CH_3OH$, $CH_4$, $CO$, $NH_3$, $H_2$, $N_2$, HBr, or combinations thereof. In example embodiments of inventive concepts, the etching process using the second etching gas may further use a second additional gas including at least one of Ne, Ar, Kr, and Xe.

The patterning process for forming the variable resistance structure 40 may be performed at a temperature of about −10° C. to about 65° C. and a pressure of about 2 mT to about 5 mT. While the patterning process for forming the variable resistance structure 40 is performed, a conductive mask pattern obtained by etching the second upper electrode layer 46a by using the mask pattern 80 as an etching mask may be partially consumed from the top surface thereof by an etching atmosphere. Thus, a thickness of the conductive mask pattern may be reduced.

In the variable resistance structure 40, a second upper electrode 46 corresponding to a remaining portion of the conductive mask pattern and a first upper electrode 44 obtained by patterning the first upper electrode layer 44a may function as an upper electrode 48.

Figure 13D:
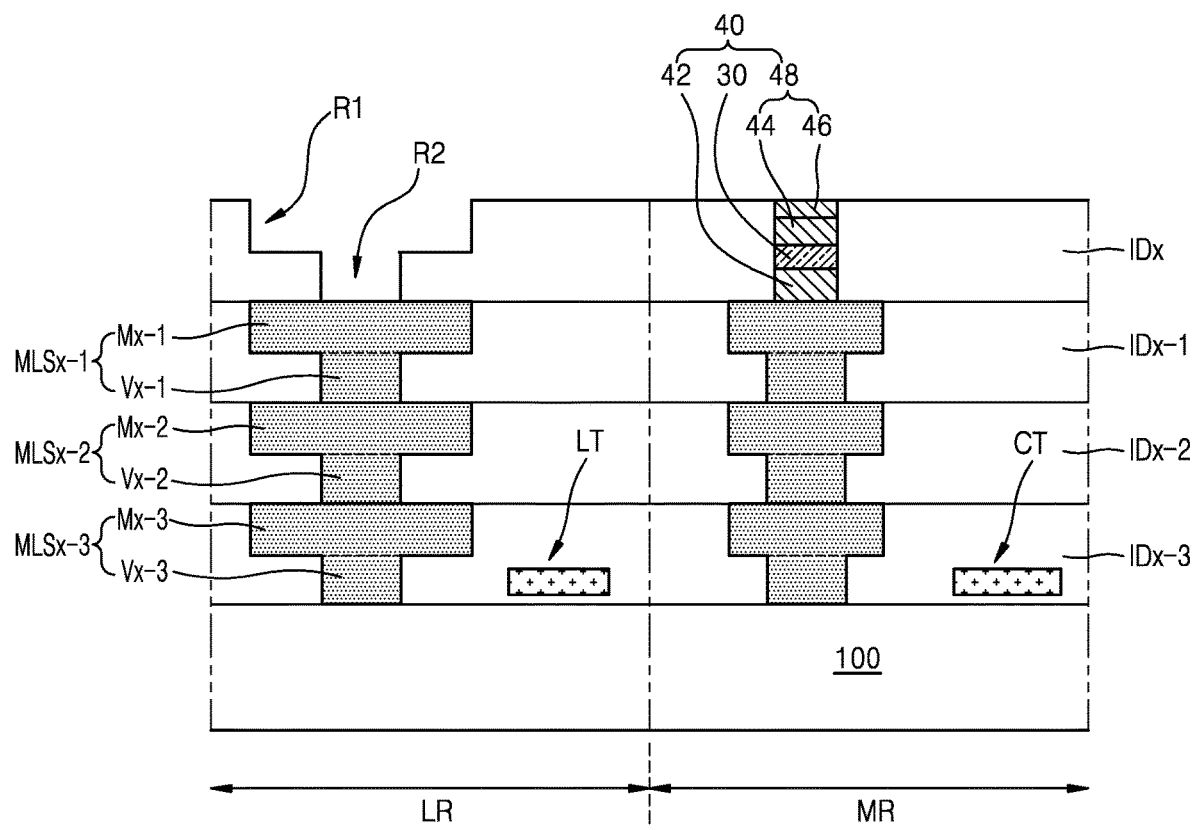

Referring to FIG. 13D, a fourth insulating layer IDx may be formed on the substrate 100 in which the variable resistance structure 40 is formed. A portion of the fourth insulating layer IDx in the logic region LR may be removed to form a first recess R1 and a second recess R2 communication with each other from the top surface of the fourth insulating layer IDx. The first recess R1 may have a relatively large width, and the second recess R2 may have a relatively smaller width than the first recess R1. The first recess R1 and the second recess R2 may expose at least a portion of the top surface of the interconnection layer Mx-1 of the third interconnection structure MLSx-1.

Figure 13E:
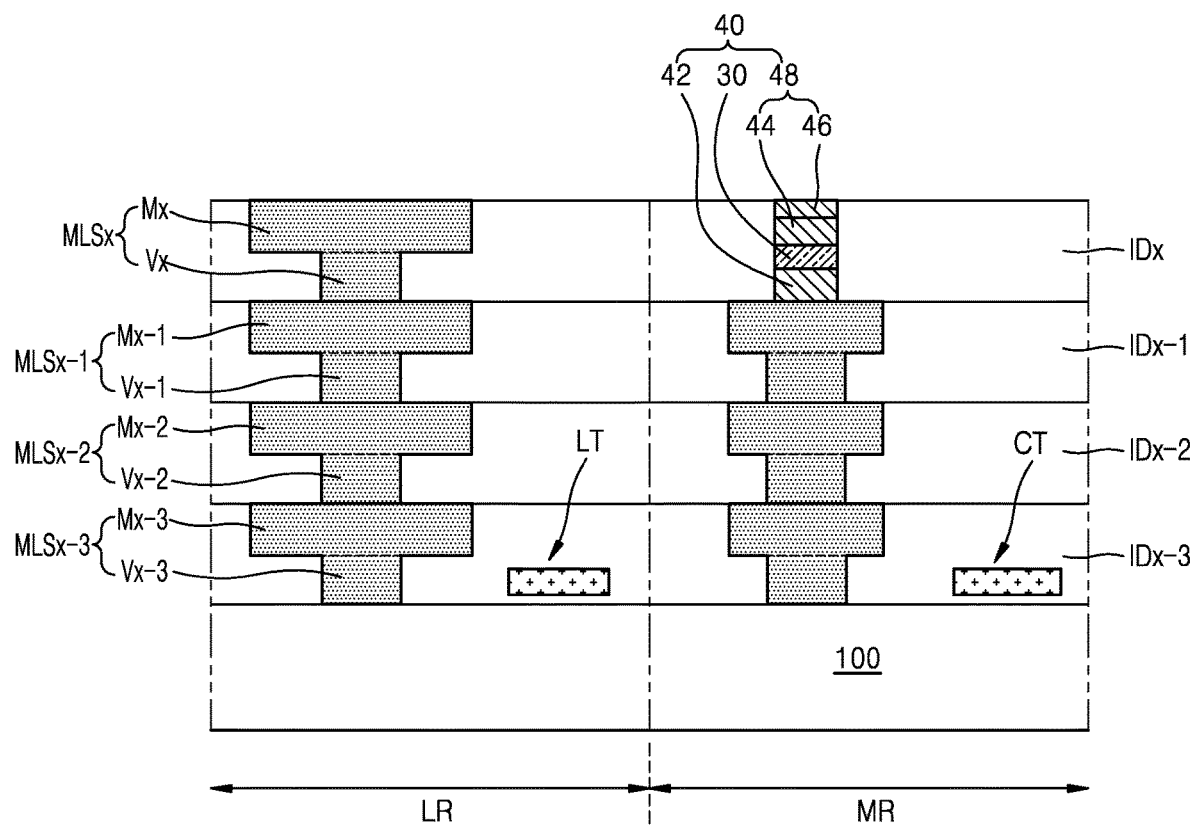

Referring to FIGS. 13D and 13E, an auxiliary interconnection material layer may be formed to fill the first recess R1 and the second recess R2 and cover the fourth insulating layer IDx. A fourth interconnection structure MLSx may be formed by exposing the top surface of the fourth insulating layer IDx through a planarization process such as a CMP process. Therefore, the via plug Vx and the interconnection layer Mx of the fourth interconnection structure MLSx may be integrally formed by using copper or a first conductive material including copper.

As described above, the fourth interconnection structure MLSx and the lower and upper electrodes 42 and 48 of the variable resistance structure 40 may be formed by separate processes. The fourth interconnection structure MLSx may be formed by a dual damascene process, and the lower and upper electrodes 42 and 48 of the variable resistance structure 40 may be formed by an etching process. Therefore, the via plug Vx and the interconnection layer Mx of the fourth interconnection structure MLSx may be integrally formed by using copper or a first conductive material including copper. The lower and upper electrodes 42 and 48 of the variable resistance structure 40 may include a second conductive material including a metal, which is different from the first conductive material. In addition, since the variable resistance structure 40 is formed through the successive etching processes, sidewalls of the upper electrode 48, the magnetoresistive device 30, and the lower electrode 42 of the variable resistance structure 40 may form a continuous surface. In addition, the upper electrode 48, the magnetoresistive device 30, and the lower electrode 42 of the variable resistance structure 40 may overlap one another with respect to a direction perpendicular to the main surface of the substrate 100.

A fifth insulating layer IDx+1 having a fifth interconnection structure MLSx+1 may be formed as illustrated in FIG. 5. In this manner, a semiconductor apparatus 3 may be manufactured.

Figure 14:
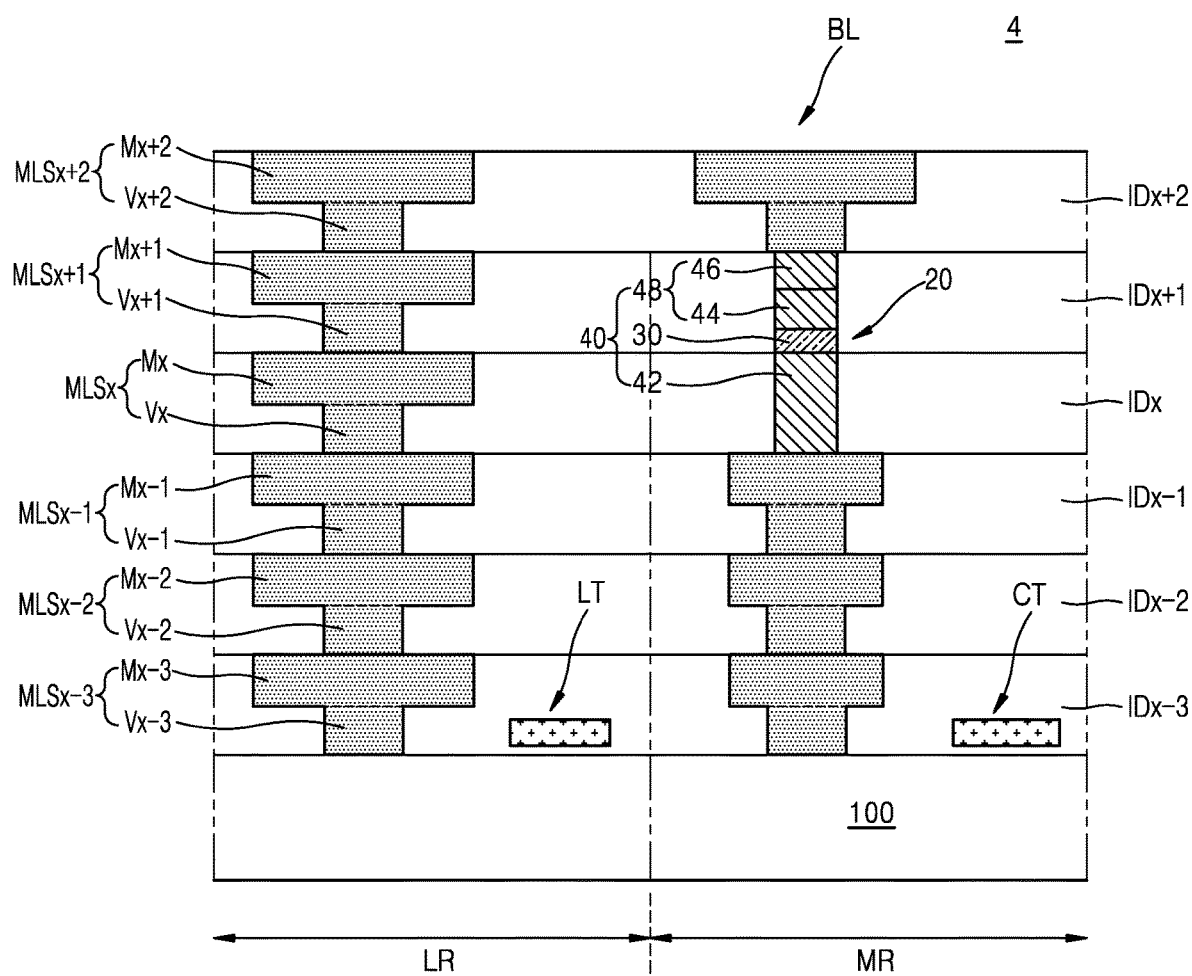
FIG. 14 is a cross-sectional view of a semiconductor apparatus according to example embodiments of inventive concepts.

FIG. 14 is a cross-sectional view of a semiconductor apparatus 4 according to example embodiments of inventive concepts. In FIG. 14, the same reference numerals as those used in FIGS. 1A to 13E refer to the same members, and detailed descriptions thereof will not be repeated.

Referring to FIG. 14, the semiconductor apparatus 4 may include a substrate 100 having a logic region LR and a memory region MR. The semiconductor apparatus 3 may include a logic device LT formed in the logic region LR and a memory cell 20 formed in the memory region MR. The logic device LT may be variously configured by a diode, a transistor, or the like. The memory cell 20 may include a magnetoresistive device 30 and a cell transistor CT. One electrode of the cell transistor CT may be connected to the bit line BL through the magnetoresistive device 30.

A plurality of insulating layers IDx−3, IDx−2, IDx−1, IDx, IDx+1, and IDx+2 may be sequentially stacked on the substrate 100. Interconnection structures MLSx−3, MLSx−2, MLSx−1, MLSx, MLSx+1, and MLSx+2 may be respectively formed in the plurality of insulating layers IDx−3, IDx−2, IDx−1, IDx, IDx+1, and IDx+2. For example, the first interconnection structure MLSx−1 may be formed in the first insulating layer IDx−3, the second interconnection structure MLSx−2 may be formed in the second insulating layer IDx−2, the third interconnection structure MLSx−1 may be formed in the third insulating layer IDx−1, the fourth interconnection structure MLSx may be formed in the fourth interconnection structure MLSx, the fifth interconnection structure MLSx+1 may be formed in the fifth insulating layer IDx+1, and the sixth interconnection structure MLSx+2 may be formed in the sixth insulating layer IDx+2. The first to sixth interconnection structures MLSx−3, MLSx−2, MLSx−1, MLSx, MLSx+1, and MLSx+2 may pass through the first to sixth insulating layers IDx−3, IDx−2, IDx−1, IDx, IDx+1, and IDx+2, respectively.

The first to sixth interconnection structures MLSx−3, MLSx−2, MLSx−1, MLSx, MLSx+1, and MLSx+2 may respectively include via plugs Vx−3, Vx−2, Vx−1, Vx, Vx+1, and Vx+2 and interconnection layers Mx−3, Mx−2, Mx−1, Mx, Mx+1, and Mx+2 disposed on the via plugs Vx−3, Vx−2, Vx−1, Vx, Vx+1, and Vx+2.

The fourth and fifth interconnection structures MLSx and MLSx+1 may be respectively formed in the fourth and fifth insulating layers IDx and IDx+1 of the logic region MR, and may not be formed in the fourth and fifth insulating layers IDx and IDx+1 of the memory region MR. A variable resistance structure 40 including the magnetoresistive device 30 may be formed in the fourth and fifth insulating layers IDx and IDx+1 of the memory region MR. The variable resistance structure 40 may include a lower electrode 42, the magnetoresistive device 30, and an upper electrode 48, which are sequentially stacked. The upper electrode 48 may include a first upper electrode 44 and a second upper electrode 46.

The lower electrode 42 and the upper electrode 48 of the variable resistance structure 40 may be connected to the third interconnection structure MLSx−1 of the third insulating layer IDx−1 and the sixth interconnection structure MLSx+2 of the sixth insulating layer IDx+2, respectively.

The semiconductor apparatus 4 according to example embodiments of inventive concepts may be disposed between one interconnection structure and another interconnection structure disposed above three or more layers from the interconnection structure, for example, between the third interconnection structure MLSx−1 and the sixth interconnection structure MLSx+2. Therefore, it is possible to ensure a height space for forming the variable resistance structure 40.

The variable resistance structure 40 may be formed over the fourth insulating layer IDx and the fifth insulating layer IDx+1. Therefore, the fourth insulating layer IDx and the fifth insulating layer IDx+1 may be referred to as base insulating layers, and the fourth interconnection structure MLSx and the fifth interconnection structure MLSx+1 may be referred to as base interconnection structures.

When the fourth and fifth insulating layers IDx and IDx+1, in which the variable resistance structure 40 is formed, are referred to as the base insulating layers, the third insulating layer IDx−1 under the base insulating layers IDx and IDx+1 and the sixth insulating layer IDx+2 above the base insulating layers IDx and IDx+1 may be respectively referred to as a first insulating layer and a second insulating layer, and the third interconnection structure MLSx−1 and the sixth interconnection structure MLSx+2 may be respectively referred to as a first interconnection structure and a second interconnection structure. That is, the variable resistance structure 40 may be formed in the base insulating layers IDx and IDx+1 disposed between the first insulating layer IDx−1 and the second insulating layer IDx+2. The first interconnection structure MLSx−1 and the second interconnection structure MLSx+2 may be electrically connected to the lower electrode 42 and the upper electrode 48 of the variable resistance structure 40, respectively.

In addition, the fourth insulating layer IDx and the fifth insulating layer IDx+1 may be respectively referred to as a lower insulating layer and an upper insulating layer, and the fourth interconnection structure MLSx and the fifth interconnection structure MLSx+1 may be respectively referred to as a lower interconnection structure and an upper interconnection structure.

The lower electrode 42 of the variable resistance structure 40 may be formed in the lower insulating layer IDx, and the magnetoresistive device 30 and the upper electrode 48 may be formed in the upper insulating layer IDx+1.

The bottom and top surfaces of the lower electrode 42 of the variable resistance structure 40 may have the same levels as the bottom and top surfaces the lower insulating layer IDx, respectively. In addition, the bottom and top surfaces of the lower electrode 42 of the variable resistance structure 40 may have the same levels as the bottom and top surfaces the lower interconnection structure MLSx, respectively.

The bottom surface of the magnetoresistive device 30 of the variable resistance structure 40 may have the same level as the bottom surface of the upper insulating layer IDx+1 and the bottom surface of the upper interconnection structure MLSx+1. In addition, the top surface of the upper electrode 48 of the variable resistance structure 40 may have the same level as the top surface of the upper insulating layer IDx+1 and the top surface of the upper interconnection structure MLSx+1.

The planar arrangement of the elements of the semiconductor apparatus 4 illustrated in FIG. 14 may be substantially similar to that illustrated in FIG. 3. Specifically, the planar arrangement of the elements of the semiconductor apparatus 4 may be achieved by applying the via plug Vx+2 and the interconnection layer Mx+2 of the second interconnection structure MLSx+2 illustrated in FIG. 4, instead of the via plug Vx+1 and the interconnection Mx+1 of the second interconnection structure MLSx+1 illustrated in FIG. 3. Thus, separate illustration and description will be omitted.

FIGS. 15A to 15F are cross-sectional views for describing a method of manufacturing a semiconductor apparatus, according to example embodiments of inventive concepts. In example embodiments of inventive concepts, a method of manufacturing the semiconductor apparatus 4 illustrated in FIG. 14 will be described. In FIGS. 15A to 15F, the same reference numerals as those used in FIGS. 1A to 14 refer to the same members, and detailed descriptions thereof will not be repeated. In the following, descriptions redundant to those of FIGS. 13A to 13E will not be repeated.

Figure 15A:
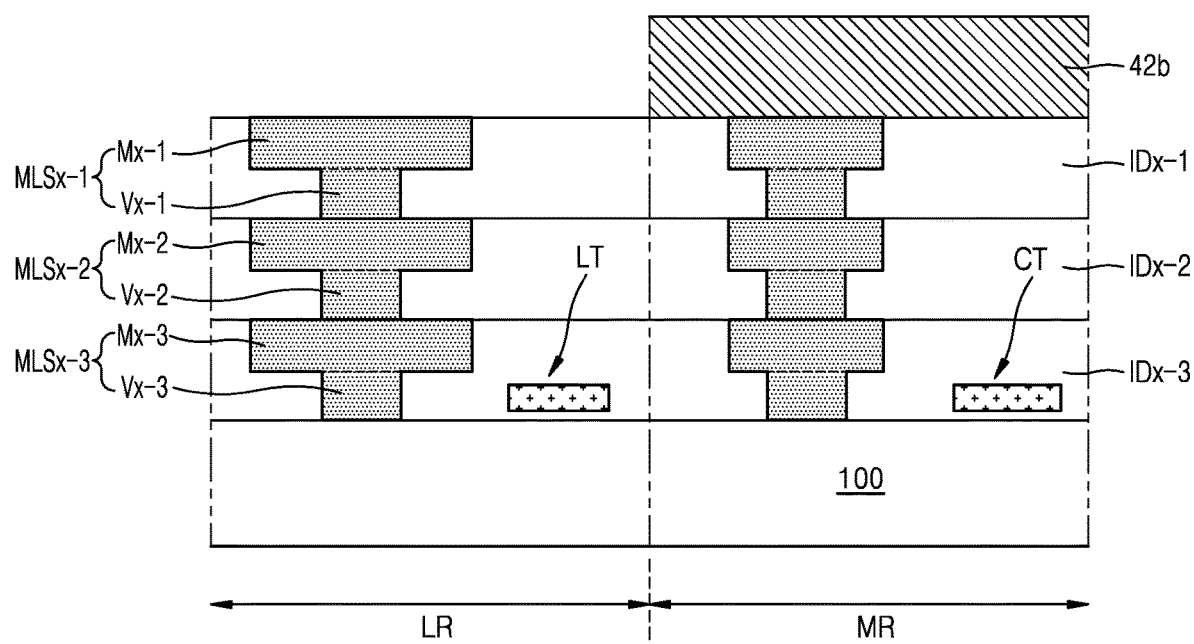
FIGS. 15A to 15F are cross-sectional views for describing a method of manufacturing a semiconductor apparatus, according to example embodiments.

Referring to FIG. 15A, first to third insulating layers IDx−3, IDx−2, and IDx−1, in which first to third interconnection structures MLSx−3, MLSx−2, and MLSx−1 are formed, may be stacked on a substrate 100 having a logic region LR and a memory region MR. A logic device LT may be formed in the logic region LR and a cell transistor CT may be formed in the memory region MR.

A lower electrode layer 42b may be formed on the third insulating layer IDx−1 of the memory region MR. In FIG. 15A, the lower electrode layer 42b is illustrated as not being formed in the logic region LR, but inventive concepts are not limited thereto. For example, the lower electrode layer 42b may also be formed in the logic region LR and be completely removed in a subsequent process.

Figure 15B:
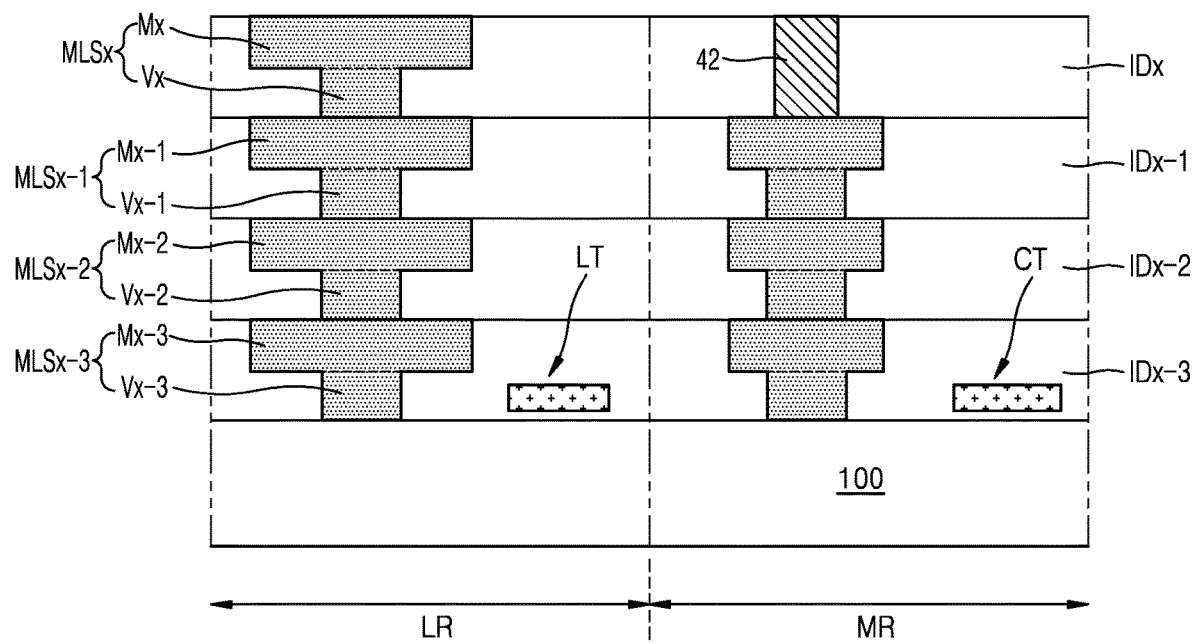

Referring to FIGS. 15A and 15B, the lower electrode layer 42b may be patterned to form a lower electrode 42. A fourth insulating layer IDx may be formed to cover the logic region LR and the memory region MR. A fourth interconnection structure MLSx may be formed in the fourth insulating layer IDx of the logic region LR. The fourth insulating layer IDx may be formed to expose the top surface of the lower electrode 42.

Figure 15C:
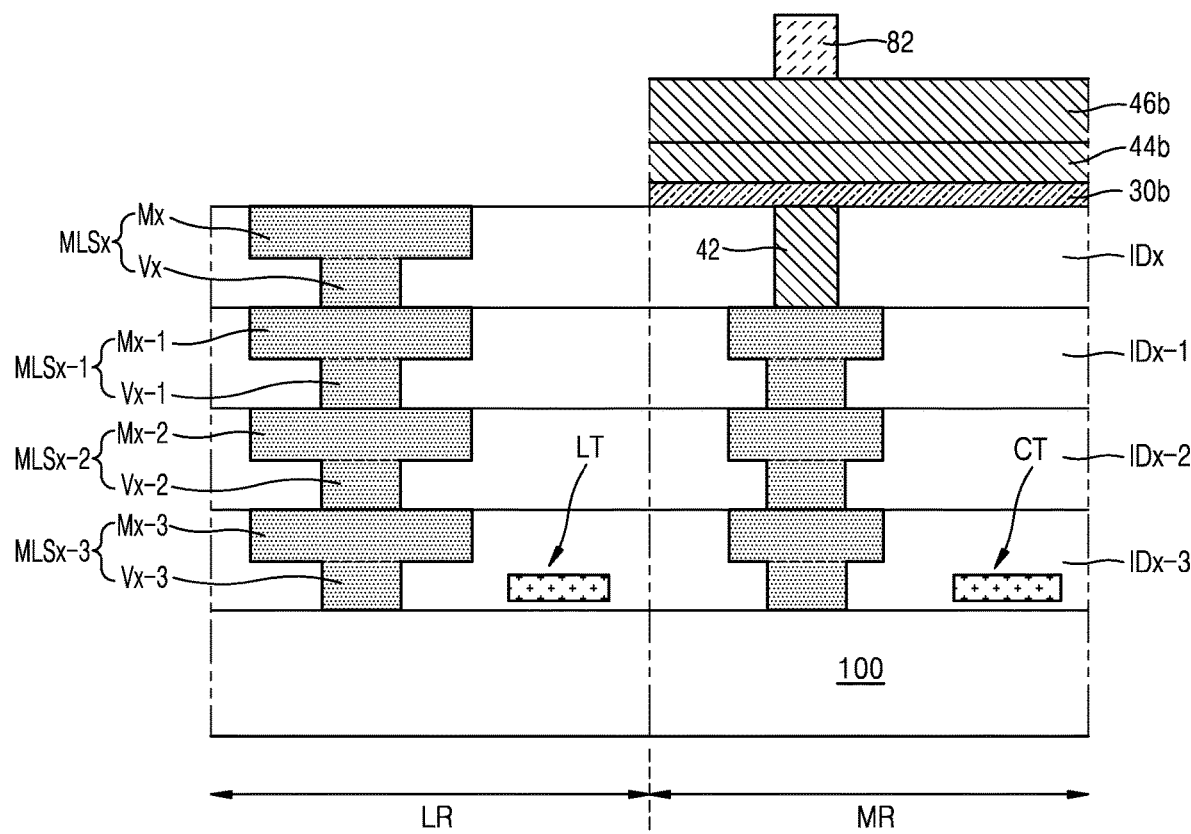

Referring to FIG. 15C, an auxiliary magnetoresistive layer 30a, a first upper electrode layer 44b, and a second upper electrode layer 46b may be sequentially stacked on the fourth insulating layer IDx of the memory region MR, and a mask pattern 82 may be formed on the second upper electrode layer 46b.

In FIG. 15C, the auxiliary magnetoresistive layer 30b, the first upper electrode layer 44b, and the second upper electrode layer 46b are illustrated as not being formed in the logic region LR, but inventive concepts are not limited thereto. For example, the auxiliary magnetoresistive layer 30b, the first upper electrode layer 44b, and the second upper electrode layer 46b may be formed in the logic region LR and be completely removed in a subsequent process.

Figure 15D:
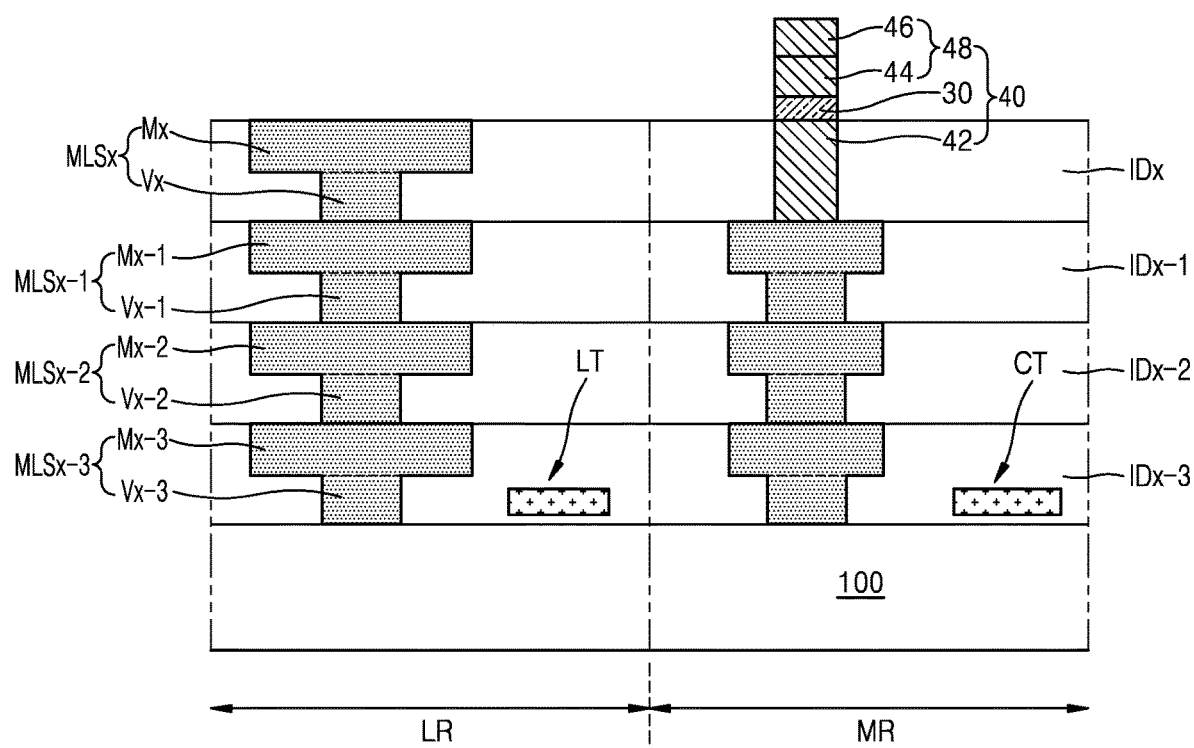

Referring to FIGS. 15C and 15D, a variable resistance structure 40 may be formed by patterning the second upper electrode layer 46b, the first upper electrode layer 44b, and the auxiliary magnetoresistive layer 30b by using the mask pattern 82 as an etching mask.

While the patterning process for forming the variable resistance structure 40 is performed, a conductive mask pattern obtained by etching the second upper electrode layer 46b by using the mask pattern 82 as an etching mask may be partially consumed from the top surface thereof by an etching atmosphere. Thus, a thickness of the conductive mask pattern may be reduced.

In the variable resistance structure 40, a second upper electrode 46 corresponding to a remaining portion of the conductive mask pattern and a first upper electrode 44 obtained by patterning the first upper electrode layer 44b may function as an upper electrode 48.

Figure 15E:
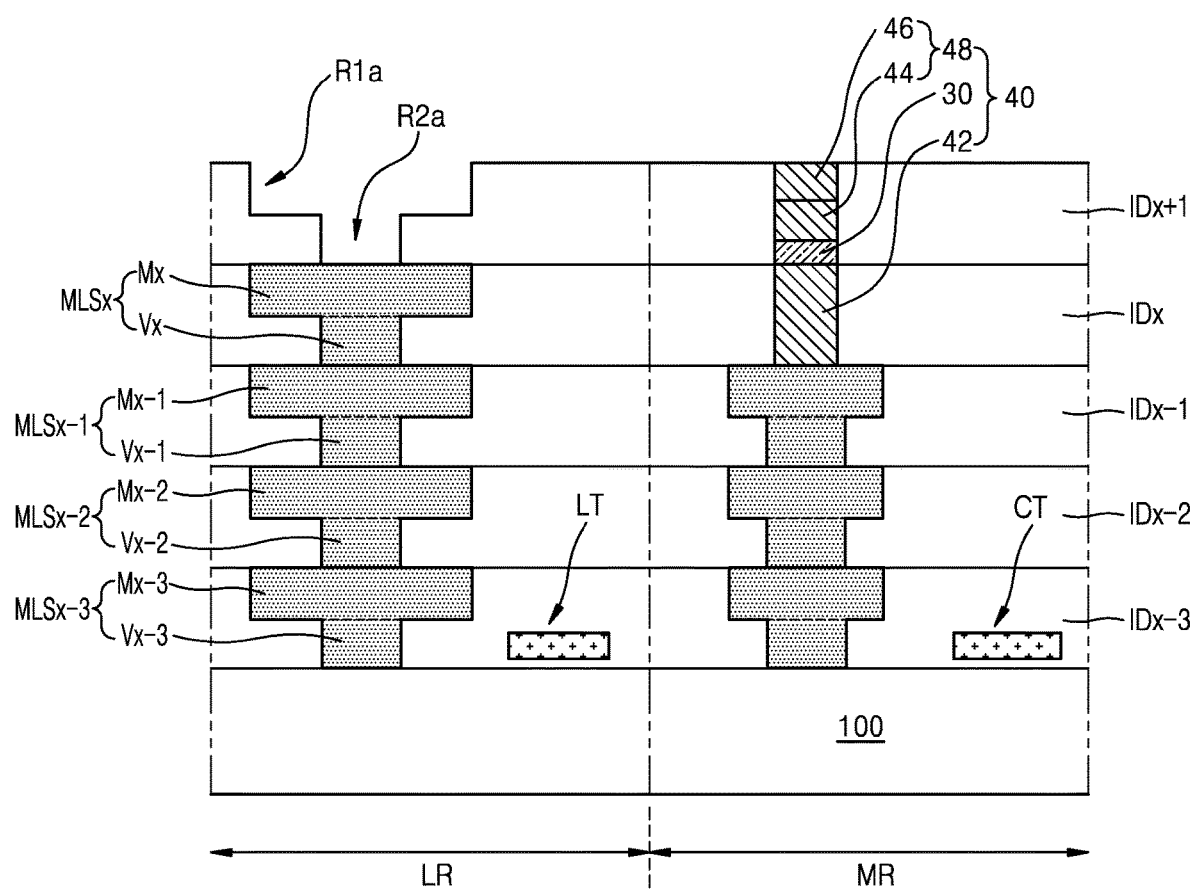

Referring to FIG. 15E, a fifth insulating layer IDx+1 may be formed on the substrate 100 in which the variable resistance structure 40 is formed. A portion of the fifth insulating layer IDx+1 in the logic region LR may be removed to form a first recess R1a and a second recess R2a communication with each other from the top surface of the fifth insulating layer IDx+1. The first recess R1a may have a relatively large width, and the second recess R2a may have a relatively smaller width than the first recess R1a. The first recess R1a and the second recess R2a may expose at least a portion of the top surface of the interconnection layer Mx of the fourth interconnection structure MLSx.

In FIGS. 15A to 15E, the lower electrode 42 is first formed by patterning the lower electrode layer 42a, and then, the variable resistance structure 40 is formed by patterning the second upper electrode layer 46b, the first upper electrode layer 44b, and the auxiliary magnetoresistive layer 30b, but inventive concepts are not limited thereto. For example, the variable resistance structure 40 may be formed by continuously patterning the second upper electrode layer 40b, the first upper electrode layer 44b, the auxiliary magnetoresistive layer 30b, and the lower electrode layer 42a, and the fifth insulating layer IDx+1 may be formed to surround the sidewall of the variable resistance structure 40.

Figure 15F:
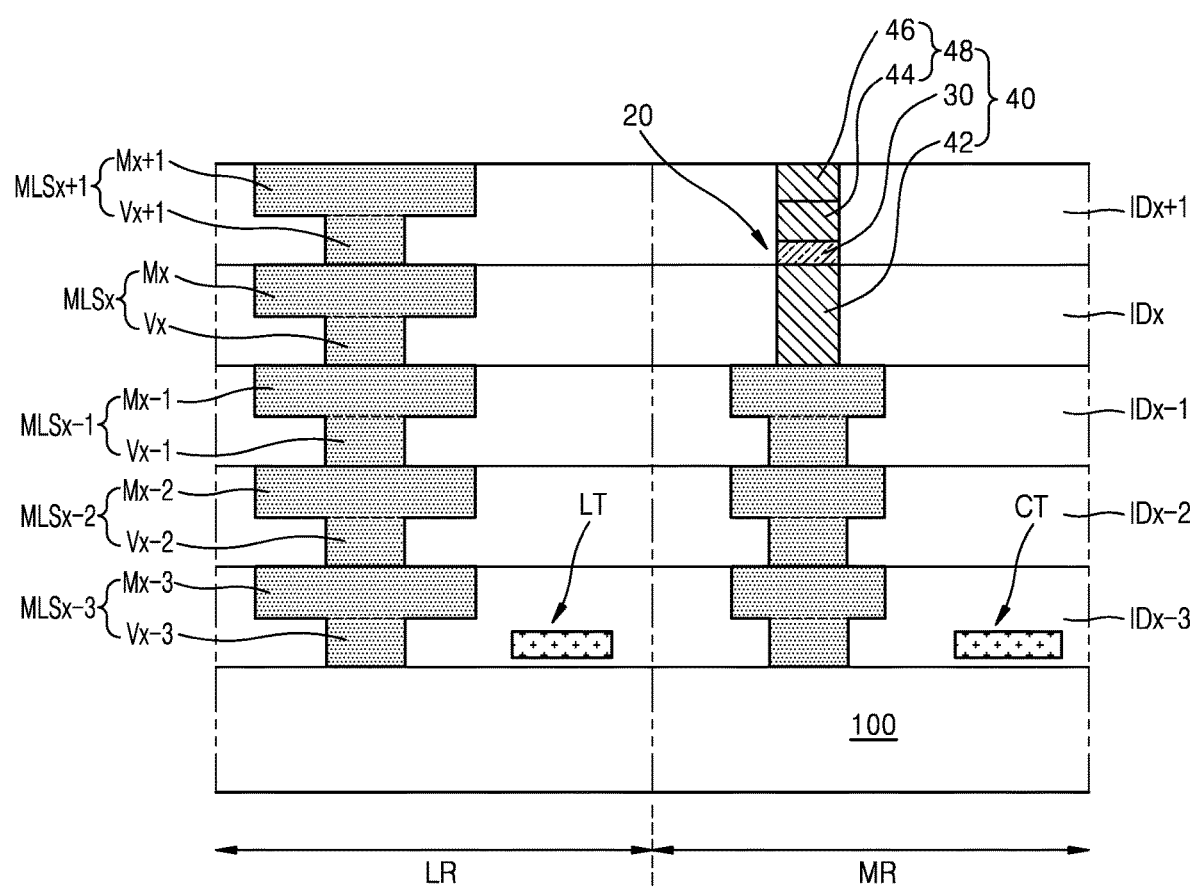

Referring to FIGS. 15E and 15F, an auxiliary interconnection material layer may be formed to fill the first recess R1a and the second recess R2a and cover the fifth insulating layer IDx+1. A fifth interconnection structure MLSx+1 may be formed by exposing the top surface of the fifth insulating layer IDx+1 through a planarization process such as a CMP process.

A sixth insulating layer IDx+2 having a sixth interconnection structure MLSx+2 may be formed as illustrated in FIG. 14. In this manner, a semiconductor apparatus 4 may be manufactured.

Figure 16:
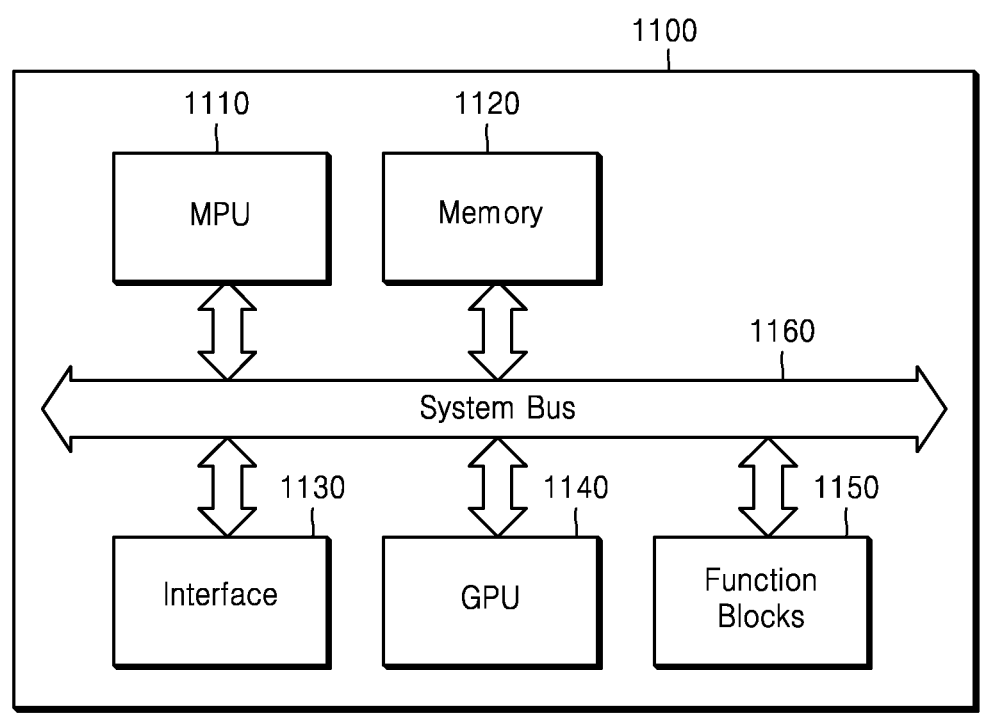
FIG. 16 is a block diagram of a semiconductor apparatus according to example embodiments of inventive concepts.

FIG. 16 is a block diagram of a semiconductor apparatus 1100 according to example embodiments of inventive concepts.

Referring to FIG. 16, the semiconductor apparatus 1100 may include a main processing unit (MPU) 1110, a memory 1120, an interface 1130, a graphic processing unit (GPU) 1140, function blocks 1150, and a system bus 1160. The system bus 1160 may mutually connect the elements of the semiconductor apparatus 1100. The semiconductor apparatus 1100 may include both or either of the MPU 1110 and the GPU 1140.

The MPU 1110 may include a core and a L2 cache. For example, the MPU 1110 may include a multi-core. Cores of the multi-core may have the same performance or have different performances. In addition, the cores of the multi-core may be activated at the same time point or at different time points. The memory 1120 may store results processed by the function blocks 1150 under the control of the MPU 1110. For example, the MPU 1110 may store contents of the L2 cache in the memory 1120 when the contents of the L2 cache are flush. The interface 1130 may perform interface with external devices. For example, the interface 1130 may perform interface with a camera, a liquid crystal display (LCD), and a speaker.

The GPU 1140 may perform graphic functions. For example, the GPU 1140 may perform a video codec or process a three-dimensional (3D) graphic.

The function blocks 1150 may perform various functions. For example, the in a case where the semiconductor apparatus 1100 is an access point (AP) used in a mobile device, some of the function blocks 1150 may perform a communication function.

The semiconductor apparatus 1100 may be any one of the semiconductor apparatuses 1, 2, 3, and 4 illustrated in FIGS. 1A to 15F. The memory 1120 may be any one of the memory cells 20 formed in the memory regions MR, MR1, MR2, MR3, and MR4 illustrated in FIGS. 1A to 15F.

The MPU 1110, the interface 1130, the GPU 1140, the function blocks 1150, and the system bus 1160 may be the logic devices LT formed in the logic regions LR, LR1, LR2, LR3, and LR4 illustrated in FIGS. 1A to 15F.

The semiconductor apparatus 1100 may include the MPU 1110 and/or the GPU 1140, and the memory 1120. The semiconductor apparatus 1100 may become smaller and lighter and have high performance and high reliability.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A semiconductor apparatus comprising:
a substrate including a logic region and a memory region;
a first insulating layer on the logic region and the memory region;
a second insulating layer on the first insulating, layer over the logic region and the memory region;
a base insulating layer between the first insulating layer and the second insulating layer over the logic region and the memory region;
first interconnection structures passing through the first insulating layer over the logic region and the memory region, respectively;
second interconnection structures passing through the second insulating layer over the logic region and the memory region, respectively;
a base interconnection structure passing through the base insulating layer over the logic region; and
a variable resistance structure in the base insulating layer over the memory region, the variable resistance structure including a lower electrode, a magnetoresistive device, and an upper electrode, which are sequentially stacked,
the lower electrode and the upper electrode being electrically connected to one of the first interconnection structures and one of the second interconnection structures respectively over the memory region, wherein
the first interconnection structures are respectively disposed on at least two interconnection structures disposed between the first interconnection structures and the substrate,
wherein each of the first interconnection structures, the second interconnection structures, and the base interconnection structure includes a via plug and an interconnection layer on the via plug, and
wherein a top surface of the upper electrode has a same level as a top surface of the interconnection layer of the base interconnection structure and a bottom surface of the lower electrode has a same level as a bottom surface of the via plug of the base interconnection structure.

2. The semiconductor apparatus of claim 1, wherein the bottom surface of the lower electrode and the top surface of the upper electrode have substantially a same level as a bottom surface and a top surface of the base insulating layer, respectively.

3. The semiconductor apparatus of claim 2, wherein a top surface of the first interconnection structures and a bottom surface of the second interconnection structures have substantially a same level as the bottom surface of the lower electrode and the top surface of the upper electrode in the variable resistance structure.

4. The semiconductor apparatus of claim 3, wherein sidewalls of the upper electrode, the magnetoresistive device, and the lower electrode of the variable resistance structure define a coplanar surface.

5. The semiconductor apparatus of claim 2, wherein the magnetoresistive device includes a tunnel barrier, a first magnetization layer; and a second magnetization layer, and the tunnel barrier is between the first magnetization layer and the second magnetization layer.

6. The semiconductor apparatus of claim 2, wherein the base interconnection structure electrically connects one of the first interconnection structures over the logic region to one of the second interconnection structures over the logic region.

7. The semiconductor apparatus of claim 2, wherein
the base insulating layer includes an upper insulating layer on a lower insulating layer, and
the base interconnection structure includes a lower interconnection structure disposed in the lower insulating layer and an upper interconnection structure in the upper insulating layer.

8. A semiconductor apparatus comprising:
a substrate including a logic region and a memory region;
a first insulating layer, a base insulating layer, and a second insulating layer sequentially arranged on the substrate;
a first interconnection structure, a base interconnection structure, and a second interconnection structure in the first insulating layer, the base insulating layer, and the second insulating layer, respectively; and
a variable resistance structure in the base insulating layer over the memory region, the variable resistance structure including a magnetoresistive device, an upper electrode connected to an upper portion of the magnetoresistive device, and a lower electrode connected to a lower portion of the magnetoresistive device,
the variable resistance structure overlapping interconnection layers of the first and second interconnection structures over the memory region in a direction perpendicular to a main surface of the substrate, wherein the first interconnection structure is disposed on at least two interconnection structures disposed between the first interconnection structure and the substrate.

9. The semiconductor apparatus of claim 8, wherein each of the first interconnection structure, the base interconnection structure, and the second interconnection structure include an interconnection layer on a via plug.

10. The semiconductor apparatus of claim 8, further comprising:
first interconnection structures and second interconnection structures on the substrate, wherein
the first interconnection structures include the first interconnection structure and the second interconnection structures include the second interconnection structure,
the first insulating layer is on the logic region and the memory region,
the second insulating layer is on the first insulating layer over the logic region and the memory region,
the base insulating layer is between the first insulating layer and the second insulating layer over the logic region and the memory region,
the first interconnection structures pass through the first insulating layer over the logic region and the memory region, respectively,
the second interconnection structures pass through the second insulating layer over the logic region and the memory region, respectively,
a base interconnection structure pass through the base insulating layer over the logic region, and
the lower electrode, the magnetoresistive device, and the upper electrode are sequentially stacked,
the lower electrode and the upper electrode are electrically connected to the first interconnection structure and the second interconnection structure respectively over the memory region, wherein
the first interconnection structures are respectively disposed on the at least two interconnection structures disposed between the first interconnection structures and the substrate.

11. The semiconductor apparatus of claim 10, wherein each of the first interconnection structures, the second interconnection structures, and the base interconnection structure include a via plug and an interconnection layer on the via plug.

12. A semiconductor apparatus comprising:
a substrate including a logic region and a memory region;
a first insulating layer, a base insulating layer, and a second insulating layer sequentially arranged on the substrate;
a first interconnection structure, a base interconnection structure and a second interconnection structure in the first insulating layer, the base insulating layer, and the second insulating layer, respectively; and
a variable resistance structure in the base insulating layer over the memory region, the variable resistance structure including a magnetoresistive device, an upper electrode connected to an upper portion of the magnetoresistive device, and a lower electrode connected to a lower portion of the magnetoresistive device,
the variable resistance structure overlapping interconnection layers of the first and second interconnection structures over the memory region in a direction perpendicular to a main surface of the substrate,
wherein the first interconnection structure is disposed on at least two interconnection structures disposed between the first interconnection structure and the substrate,
wherein each of the first interconnection structure, the base interconnection structure, and the second interconnection structure include an interconnection layer on a via plug, and
wherein a top surface of the upper electrode has, a same level as a top surface of the interconnection layer of the base interconnection structure and a bottom surface of the lower electrode has a same level as a bottom surface of the via plug of the base interconnection structure.

13. The semiconductor apparatus of claim 12, wherein, in the logic region,
the interconnection layer of the first interconnection structure is connected to the via plug of the base interconnection structure, and
the interconnection layer of the base interconnection structure is connected to the via plug of the second interconnection structure.

14. The semiconductor apparatus of claim 12, wherein, a top surface of the variable resistance structure of the memory region has substantially a same level as the top surface of the interconnection layer of the base interconnection structure over the logic region.

15. The semiconductor apparatus of claim 12, wherein a bottom surface of the variable resistance structure over the memory region has substantially a same level as the bottom surface of the via plug of the base interconnection structure over the logic region.

16. The semiconductor apparatus of claim 12, wherein the variable resistance structure overlaps the via plugs of the first interconnection structure and the second interconnection structure over the memory region in the direction perpendicular to the main surface of the substrate.

17. The semiconductor apparatus of claim 12, wherein the via plugs and the interconnection layers of each of the first interconnection structure, the second interconnection structure, and the base interconnection structure are integrally formed.

18. The semiconductor apparatus of claim 12, wherein the first interconnection structure, the second interconnection structure, and the base interconnection structure respectively pass through the first insulating layer, the second insulating layer, and the base insulating layer.

19. The semiconductor apparatus of claim 12, wherein each of the first insulating layer, the second insulating layer, and the base insulating layer includes an oxide film or a low-k dielectric film.

20. The semiconductor apparatus of claim 12, wherein each of the interconnection structures comprises copper or a conductive material including copper.

* * * * *